United States Patent
Yu et al.

(10) Patent No.: US 8,934,311 B2
(45) Date of Patent: Jan. 13, 2015

(54) SEMICONDUCTOR MEMORY DEVICE CAPABLE OF SCREENING A WEAK BIT AND REPAIRING THE SAME

(75) Inventors: Hak-soo Yu, Seongnam-si (KR); Uk-song Kang, Seongnam-si (KR); Chul-woo Park, Yongin-si (KR); Joo-sun Choi, Yongin-si (KR); Hong-Sun Hwang, Suwon-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 83 days.

(21) Appl. No.: 13/604,308

(22) Filed: Sep. 5, 2012

(65) Prior Publication Data

US 2013/0058145 A1 Mar. 7, 2013

Related U.S. Application Data

(60) Provisional application No. 61/531,197, filed on Sep. 6, 2011.

(30) Foreign Application Priority Data

May 10, 2012 (KR) .................. 10-2012-0049775

(51) Int. Cl.
*G11C 29/44* (2006.01)
*G11C 29/50* (2006.01)
*G11C 29/00* (2006.01)
G11C 29/04 (2006.01)
G11C 11/41 (2006.01)

(52) U.S. Cl.
CPC ........ *G11C 29/50* (2013.01); *G11C 2029/0409* (2013.01); *G11C 29/783* (2013.01); *G11C 2029/4402* (2013.01); *G11C 11/41* (2013.01)
USPC ..... 365/201; 365/200; 365/189.2; 365/225.7; 365/230.03; 365/149; 714/6.2; 714/42

(58) Field of Classification Search
USPC ................. 365/230.03, 201, 200, 189.2, 149, 365/225.7; 714/6.2, 42
See application file for complete search history.

(56) References Cited

U.S. PATENT DOCUMENTS

| | | | | |
|---|---|---|---|---|
| 5,604,703 | A | * | 2/1997 | Nagashima .................. 365/200 |
| 5,961,653 | A | | 10/1999 | Kalter et al. |
| 6,714,466 | B2 | | 3/2004 | Park et al. |
| 6,928,588 | B2 | | 8/2005 | Tzeng |
| 7,075,851 | B2 | * | 7/2006 | Tanaka ..................... 365/230.06 |
| 7,697,332 | B2 | * | 4/2010 | Qu et al. .................. 365/185.09 |
| 2010/0271891 | A1 | | 10/2010 | Dell et al. |

* cited by examiner

*Primary Examiner* — Andrew Q Tran
(74) *Attorney, Agent, or Firm* — Harness, Dickey & Pierce, P.L.C.

(57) ABSTRACT

A semiconductor device includes a first memory region including a plurality of memory cells; a test unit configured to test the first memory region, and detect a weak bit from among the plurality of memory cells; and a second memory region configured to store a weak bit address (WBA) of the first memory region, and data intended to be stored in the weak bit, wherein the first memory region and the second memory region include different types of memory cells.

6 Claims, 39 Drawing Sheets

FIG. 16

|  | Row | Column | Bank |
|---|---|---|---|
| 2Gb (512Mb×4) | WBA[28:14] | WBA[13:3] | WBA[2:0] |
| 2Gb (256Mb×8) | WBA[27:13] | WBA[12:3] | WBA[2:0] |
| 4Gb (1Gb×4) | WBA[29:14] | WBA[13:3] | WBA[2:0] |
| 4Gb (512Mb×8) | WBA[28:13] | WBA[12:3] | WBA[2:0] |

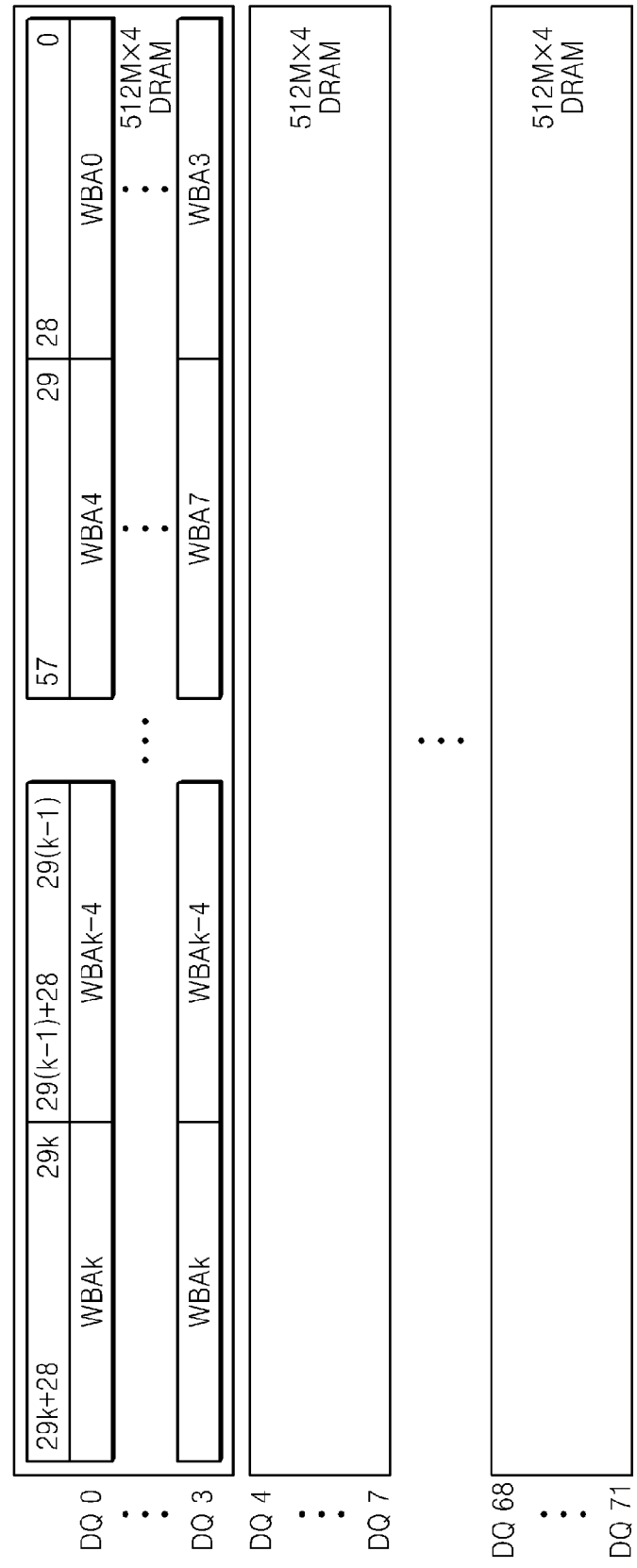

FIG. 19

| WBA0 | WBA1 | ... | WBAk−1 | WBAk |
|---|---|---|---|---|
| WBA0[27:0]=DQ0[27:0] | WBA1[27:0]=DQ0[56:28] | ... | WBAk−1[27:0]=DQ0[28(k−1)+27:28(k−1)] | WBAk[27:0]=DQ0[28k+27:28k] |

| Entry Identification No. | Row max...r0 | Column cmax...c0 | Bank bmax...b0 |
|---|---|---|---|
| 0 | | | |
| 1 | | | |
| . | | | |
| . | | | |
| . | | | |
| ENmax | | | |

FIG. 25

| Entry Identification No. | DQmax............................DQ0 |
|---|---|
| 0 | |
| 1 | |
| . | |
| . | |
| . | |
| ENmax | |

FIG. 26

| Entry Identification No. | Row max...r0 | Column cmax...c0 | Bank bmax...b0 | SCB p-1...0 |
|---|---|---|---|---|
| 0 | | | | |
| 1 | | | | |
| . | | | | |
| . | | | | |
| . | | | | |
| ENmax | | | | |

FIG. 27

| Direct Mapping (Chip Base) | DQs | 71 68 | 67 64 | ··· | ··· | 7 4 | 3 0 |
|---|---|---|---|---|---|---|---|
| | SCB[17:0] | 1 | 0 | ··· | ··· | 1 | 0 |

| Encoding Mapping (Chip Base) | SCB[4:0] | 0b10001 | 0b10000 | | | 0b00001 | 0b00000 |
|---|---|---|---|---|---|---|---|

FIG. 28

| SCB | DRG | The Nubmer Of Bits (SCB+DRG) | The Nubmer Of WBAs Per Chip | The Nubmer Of Bits Of Row+Column+Bank | WBA Table Desity Per Rank | Data SRAM Density Per Rank | Case |
|---|---|---|---|---|---|---|---|
| 1 | ×72 | 73 | 1024 | 28 | 252k (~1M@4rank) | 73k (292k@4rank) | ×8 Rank-base |
| 1 | ×72 | 73 | 1024 | 29 | 522k (2M@4rank) | 73k (292k@4rank) | ×4 Rank-base |

FIG. 29

| SCB | DRG | The Nubmer Of Bits (SCB+DRG) | The Nubmer Of WBAs Per Chip | The Nubmer Of Bits Of Row+Column+Bank | WBA Table Desity Per Rank | Data SRAM Density Per Rank | Case |
|---|---|---|---|---|---|---|---|
| 9 | ×8 | 17 | 1024 | 28 | 252k (~1M@4rank) | 17k (68k@4rank) | ×8 Chip-base |
| 18 | ×4 | 22 | 1024 | 29 | 522k (2M@4rank) | 22k (88k@4rank) | ×4 Chip-base |

FIG. 31A

| | Rank | The Number of WBAs | Row | Column | Bank | SCB |
|---|---|---|---|---|---|---|
| Meta 0 | 00 | ENmax 0 | WBA[46:32] | WBA[31:21] | WBA[20:18] | WBA[17:0] |
| Meta 1 | 01 | ENmax 1 | WBA[46:32] | WBA[31:21] | WBA[20:18] | WBA[17:0] |
| Meta 2 | 10 | ENmax 2 | WBA[46:32] | WBA[31:21] | WBA[20:18] | WBA[17:0] |
| Meta 3 | 11 | ENmax 3 | WBA[46:32] | WBA[31:21] | WBA[20:18] | WBA[17:0] |

FIG. 31B

| DQs | 71 | 68 | 67 | 64 | ... | ... | 7 | 4 | 3 | 0 |
|---|---|---|---|---|---|---|---|---|---|---|
| SCB[17:0] | 1 | | 0 | | ... | ... | 1 | | 0 | |

FIG. 32A

|  | Rank | The Number of WBAs | Row | Column | Bank | SCB |
|---|---|---|---|---|---|---|
| Meta 0 | 00 | ENmax 0 | WBA[36:22] | WBA[21:12] | WBA[11:9] | WBA[8:0] |
| Meta 1 | 01 | ENmax 1 | WBA[36:22] | WBA[21:12] | WBA[11:9] | WBA[8:0] |
| Meta 2 | 10 | ENmax 2 | WBA[36:22] | WBA[21:12] | WBA[11:9] | WBA[8:0] |
| Meta 3 | 11 | ENmax 3 | WBA[36:22] | WBA[21:12] | WBA[11:9] | WBA[8:0] |

FIG. 32B

| DQs | 71 | 64 | 63 | 56 | ... | ... | 15 | 8 | 7 | 0 |
|---|---|---|---|---|---|---|---|---|---|---|
| SCB[8:0] | | 1 | | 0 | ... | ... | | 0 | | 1 |

FIG. 35

|  | 4th | 3rd | 2nd | 1st |
|---|---|---|---|---|
| SBCD0 | SCB | EID | BOD | CMD |
| SBCD1 | SCB | EID | BOD | CMD |
| SBCD2 | SCB | EID | EID | RID |
| SBCD3 | SCB | EID | EID | RID |
| SBCD4 | SCB | EID | EID | CHP |
| SBCD5 | RES | EID | EID | BOD |

FIG. 36

| Name | Field Label | Bit Count | Bit Range | Comment |
|---|---|---|---|---|
| Command | COM | 2 | COM[1:0]={SBCD1[0], SBCD0[0]} | Read(00)/ Status Register(10)/ No Match(11) |
| Rank ID | RID | 2 | RID[1:0]={SBCD3[0], SBCD2[0]} | Maximum 4 rank |
| Burst Chop | CHP | 1 | CHP=SBCD4[0] | BL8/BL4 |
| Burst Ordering | BOD | 3 | BOD[2:0]={SBCD1[1], SBCD0[1], SBCD5[0]} | |
| Entry Identification Number | EID | 10 | EID[9:0]={SBCD5[2], SBCD4[2], SBCD3[2], SBCD2[2], SBCD1[2], SBCD0[2], SBCD5[1], SBCD4[1], SBCD3[1], SBCD2[1]} | The Number of WBAs= 1024 |
| Switch Control Bit | SCB | 5 | SCB[4:0]={SBCD4[3], SBCD3[3], SBCD2[3], SBCD1[3], SBCD0[3]} | Nibble base (×4) |
| Reserved | RES | 1 | | |

FIG. 37

| | T0 | T1 | T2 | T3 | T4 | T5 | T6 | T7 | T8 | T9 | T10 | T11 | T12 | T13 | T14 | Tx |
|---|---|---|---|---|---|---|---|---|---|---|---|---|---|---|---|---|
| Match | No | No | Yes | X | X | X | No | Yes | X | X | X | Yes | X | X | X | – |
| SBCD0 | 1 | 1 | 0 | BOD | EID | SCB | 1 | 0 | BOD | EID | SCB | 0 | BOD | EID | SCB | – |
| SBCD1 | 1 | 1 | 1 | BOD | EID | SCB | 1 | 1 | BOD | EID | SCB | 1 | BOD | EID | SCB | – |
| SBCD2 | 1 | 1 | RID | EID | EID | SCB | X | RID | EID | EID | SCB | RID | EID | EID | SCB | – |
| SBCD3 | 1 | 1 | RID | EID | EID | SCB | X | RID | EID | EID | SCB | RID | EID | EID | SCB | – |
| SBCD4 | 1 | 1 | CHP | EID | EID | SCB | X | CHP | EID | EID | SCB | CHP | EID | EID | SCB | – |
| SBCD5 | 1 | 1 | BOD | EID | EID | RES | X | BOD | EID | EID | RES | BOD | EID | EID | RES | – |
| Packet | | | | Packet 0 | | | | | Packet 1 | | | | Packet 2 | | | |

FIG. 40

| DRAM (Rank-base) | Weak Bit Address Table and Data SRAM (Rank-base) | |
|---|---|---|
| | Array Power | Peripheral Power |
| Active Power Down | On | Off |
| Precharge Power Down | On | Off |
| Auto Refresh | On | Off (or On when SRAM Scrubbing) |
| Self Refresh | On | Off |
| PASR | On | On |
| BFM | On | Off (or On when access necessary) |

SEMICONDUCTOR MEMORY DEVICE CAPABLE OF SCREENING A WEAK BIT AND REPAIRING THE SAME

CROSS-REFERENCE TO RELATED APPLICATIONS

This application claims the benefit of U.S. Provisional Patent Application No. 61/531,197, filed on Sep. 6, 2011, in the U.S. Patent and Trademark Office, and the benefit of Korean Patent Application No. 10-2012-0049775, filed on May 10, 2012, in the Korean Intellectual Property Office, the entire contents of each of which are incorporated herein by reference.

BACKGROUND

1. Field

Example embodiments relate to a memory system, and more particularly, to a semiconductor device that screens a weak bit from among memory cells and repairs the weak bit, and a memory module and a memory system which include the semiconductor device.

2. Related Art

A semiconductor device that is widely used in a high-performance electronic system has increased capacity and speed. A dynamic random access memory (DRAM), which is an example of the semiconductor device, may have a decreased cell capacitor and a small feature size according to a process scaling. However, due to the decreased cell capacitor and the small feature size, various device characteristics may deteriorate. For example, cells having a short refresh time may increase in number, a cell write characteristic may deteriorate, or cells having a variable retention time may increase in number. However, an area penalty problem of a DRAM chip may be caused when the weak cells with the aforementioned weak characteristics are replaced by using redundancy DRAM cells.

SUMMARY

Example embodiments provide a semiconductor device that screens a weak bit from among memory cells and repairs the weak bit, and a memory module and a memory system which include the semiconductor device.

According to an aspect of example embodiments, there is provided a semiconductor device including a first memory region including a plurality of memory cells, a test unit testing the first memory region, and detecting a weak bit from among the plurality of memory cells, and a second memory region storing a weak bit address (WBA) of the first memory region, and data intended to be stored in the weak bit. The first memory region and the second memory region include different types of memory cells.

The semiconductor device may further include a third memory region that stores the WBA of the first memory region in a non-volatile manner.

The first memory region may be formed as dynamic random access memory (DRAM) cells. The weak bit may be a bit from among the DRAM cells which has a weak refresh characteristic, a weak cell write characteristic, or a weak data retention characteristic.

The second memory region may be formed as a static random access memory (SRAM) cell.

The third memory region may be formed as one of an anti-fuse array and a fuse array.

The test unit may screen the WBA by using a test sequence consisting of various combinations of a command and addressing. In a test, the test unit may generate an active-precharge command without a read or write command. The test sequence may generate a nested address pattern in which a lower address sequence loop exits in an upper address sequence loop.

In a factory, the test unit may screen the WBA of the first memory region and then, may store the WBA and corresponding data in an error log register.

The test unit may provide a user-set test sequence for programming a user-desired test pattern in an in-field.

The test unit may change a direct current (DC) bias level of the first memory region during a test. The test unit may adjust the DC bias level by using a mode register in the first memory region. The mode register may be controlled by a test equipment that tests the semiconductor device.

The test unit may adjust an alternating current (AC) timing parameter of the first memory region with a predetermined resolution. The test unit may adjust the AC timing parameter by using an AC timing control register in the first memory region. The AC timing control register may be controlled by a test equipment that tests the semiconductor device.

The second memory region may repair the weak bit of the first memory region by a bit unit, a chip unit, a chip group unit, or a rank unit, according to data replacement granularity (DRG). The second memory region may select a bit to be repaired, by using a switch control bit (SCB) that is allocated to data input/output signals (DQs) of the first memory region. The second memory region may select the bit to be repaired by using the DRG and the SCB, by mapping the bit to the DQs.

The second memory region may store the WBA, and may be formed as a content-addressable memory (CAM) that performs an address matching operation with respect to a request address. The address matching operation may involve comparing the request address and a row address of the WBA, and then, comparing the request address and a column address of the WBA.

The second memory region may include a WBA table SRAM storing the WBA, a data SRAM storing data intended to be stored in the WBA, and a switch switching the first memory region or the data SRAM, and the WBA table SRAM and the data SRAM may communicate via an off-chip interface.

The second memory region may include a sideband control unit that is connected to the WBA table SRAM and that delivers a sideband control data packet indicating matching of the WBA to the switch via sideband buses (SBB). The sideband control unit may deliver the sideband control data packet by using preamble and postamble signals.

The second memory region may perform a scrubbing operation so as to correct its own error during a refresh cycle of the first memory region.

The semiconductor device may perform power management so as to allow the second memory region to be turned on in a power down mode, a refresh mode, or a test mode of the first memory region. The semiconductor device may allow a start and wake-up of a power saving mode of the second memory region to be first performed, compared to the first memory region.

During read/write operations with respect to the first memory region, the semiconductor device may turn off data input or output buffers of the first memory region that is to be replaced with the second memory region at a request address.

The semiconductor device may turn off a data path of the first memory region by using data mask (DM) signals of the first memory region.

The third memory region may store a metatable consisting of a rank address with respect to the WBA, the number of WBAs, row, column, and bank addresses with respect to the WBA, and SCBs for mapping a bit to be repaired to DQs.

The metatable may be stored in the second memory region during a power-up of the semiconductor device, and row, column, bank, and rank addresses requested by a host may be compared with the metatable stored in the second memory region, whereby a match signal is generated, and the weak bit may be repaired via DQs that are mapped to the SCBs.

The first memory region may have a stack structure in which a plurality of DRAM chips are electrically connected to each other via through silicon vias (TSVs) and microbumps. The test unit and the second memory region may be mounted in an interface chip, and the first memory region may be disposed on the interface chip.

According to another aspect of example embodiments, there is provided a memory module including a module board, at least one memory chip mounted on the module board and including a plurality of memory cells, and a memory buffer chip mounted on the module board and managing operations of the at least one memory chip. The memory buffer chip may include a test unit that detects a weak bit from among the plurality of memory cells, a first memory region that stores a weak bit address (WBA) of the at least one memory chip, and data intended to be stored in the weak bit, and a second memory region that stores the WBA of the at least one memory chip in a non-volatile manner. The at least one memory chip, and the first memory region in the memory buffer chip may include different types of memory cells.

According to another aspect of example embodiments, there is provided a memory controller that communicates with a memory chip including a plurality of memory cells, wherein the memory controller including a test unit that detects a weak bit from among the plurality of memory cells, a first memory region that stores a weak bit address (WBA) of the memory chip, and data intended to be stored in the weak bit, and a second memory region that stores the WBA of the memory chip in a non-volatile manner. The memory chip and the first memory region may include different types of memory cells.

According to another aspect of example embodiments, a semiconductor device may include a first memory region including a plurality of RAM memory cells; a test unit configured to detect a bit address of a weak cell from among the plurality of memory cells; and a second memory region including a plurality of RAM cells configured to store the detected address as a weak bit address (WBA), and configured to store data addressed to be stored at the detected address.

BRIEF DESCRIPTION OF THE DRAWINGS

The above and other features and advantages of example embodiments will become more apparent by describing in detail example embodiments with reference to the attached drawings. The accompanying drawings are intended to depict example embodiments and should not be interpreted to limit the intended scope of the claims. The accompanying drawings are not to be considered as drawn to scale unless explicitly noted.

FIG. 16 illustrates WBA fields of the BFM, according to at least one example embodiment;

FIGS. 17 through 20 illustrate mapping between WBAs and data input/output signals (DQs) in the BFM, according to at least one example embodiment;

FIGS. 24 through 26 illustrate formats of a WBA table and a data static random access memory (SRAM), according to at least one example embodiment;

FIG. 27 illustrates a switch control bit (SCB) mapping operation according to at least one example embodiment;

FIGS. 28 and 29 illustrate a capacity of a WBA table and the data SRAM according to combinations of data replacement granularity (DRG) and the SCB;

FIGS. 31A and 31B illustrate a format of a metatable, according to at least one example embodiment;

FIGS. 32A and 32B illustrate a format of a non-volatile memory (NVM), according to at least one example embodiment;

FIGS. 35 and 36 illustrate a layout and fields of a sideband control data packet, according to at least one example embodiment;

FIGS. 37 and 38 illustrate operation timing of sideband buses (SBB), according to at least one example embodiment;

FIG. 40 illustrates power management according to at least one example embodiment;

DETAILED DESCRIPTION OF THE EMBODIMENTS

Figure 1:
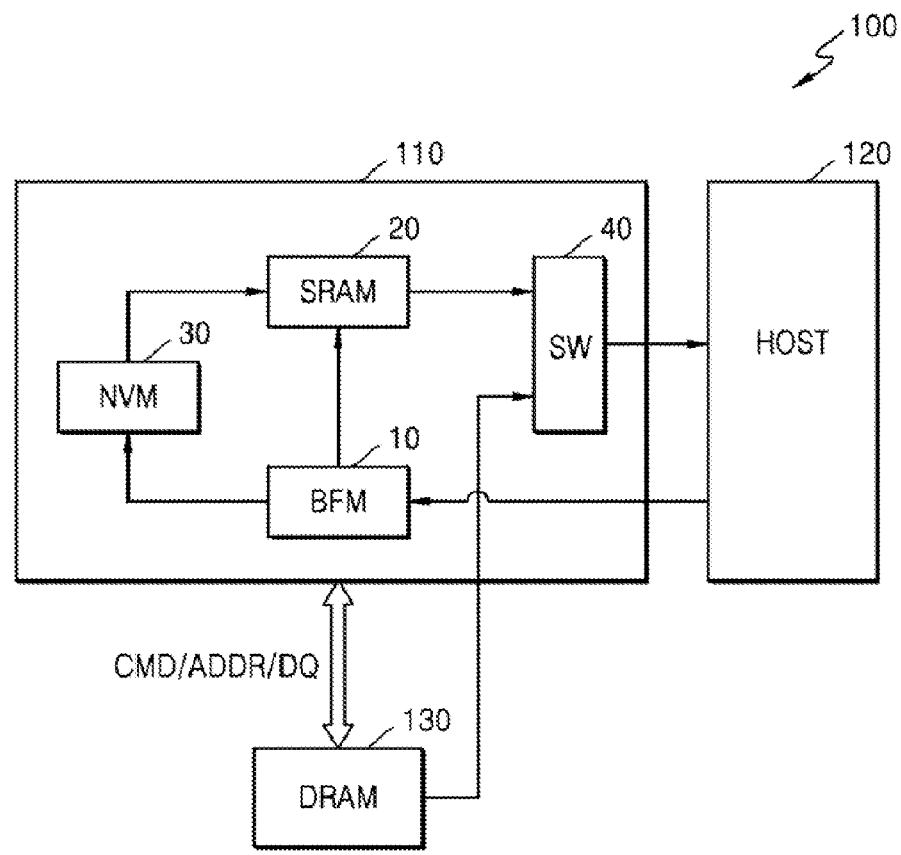
FIG. 1 is a diagram of a memory system including a memory buffer chip, according to at least one example embodiment.

Detailed example embodiments are disclosed herein. However, specific structural and functional details disclosed herein are merely representative for purposes of describing example embodiments. Example embodiments may, however, be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but to the contrary, example embodiments are to cover all modifications, equivalents, and alternatives falling within the scope of example embodiments. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

According to a dynamic random access memory (DRAM) scaling, a cell capacitor is decreased, and a small feature size is embodied. Due to the decreased cell capacitor and the small feature size, various device characteristics may deteriorate. For example, cells having a short refresh time may increase in number, a cell write characteristic may deteriorate, or cells having a variable retention time may increase in number. However, an area penalty problem of a DRAM chip may be caused when the weak cells with the weak characteristics are replaced by redundancy DRAM cells.

Furthermore, because the weak characteristics are equally exhibited in the redundancy DRAM cells, a yield rate may deteriorate.

In a case where the weak cells are replaced by a memory that is separate from a DRAM, it may be desirable to use weak cell replacement technology that does not deteriorate a function of a memory system and that is transparent to an external host controller. In general, weak cell screening is performed in a factory due to a test environment construction, and complexity of a detection pattern. Accordingly, there is a demand for a memory system that replaces weak cells by using an external memory and that is transparent to a host, based on a memory buffer having a built-in self-test technique capable of detecting a weak cell at a factory level.

FIG. 1 is a diagram of a memory system 100 including a memory buffer chip 110, according to at least one example embodiment.

Referring to FIG. 1, the memory system 100 includes the memory buffer chip 110, a host 120, and a memory device 130. The memory buffer chip 110 may include a test unit 10 for detecting weak memory cells in the memory device 130, and a first memory unit 20 for replacing the weak memory cells in the memory device 130. The test unit 10 may use a built-in self-test for memory (BFM), and the first memory unit 20 may use a static random access memory (SRAM) that is a volatile memory.

The memory buffer chip 110 may further include a second memory unit 30 that stores weak memory cell addresses when weak memory cells are detected by the test unit 10. The second memory unit 30 may use a non-volatile memory (NVM) such as a fuse array or an anti-fuse array. Hereinafter, for convenience of description, the test unit 10 may be referred to as 'BFM 10', the first memory unit 20 may be referred to as 'SRAM 20', and the second memory unit 30 may be referred to as 'NVM 30'. Also, the memory buffer chip 110 may be referred to as 'buffer chip 110', and the memory device 130 may be referred to as 'DRAM 130', 'memory module', or 'module'.

The BFM 10 is a key element that screens weak bits in the DRAM 130. The weak bits indicate bit addresses of weak cells that exhibit a weak characteristic in a refresh, a cell write characteristic, or a data retention time. Cell write characteristics may include, for example, an amount of time or power required to complete a cell write operation. Refresh characteristics may include, for example, an amount of time or power required to complete a refresh operation. Data retention time characteristics may include, for example, an amount of time data is retained in a cell after being programmed in the cell. A weak characteristic may be defined as a characteristic of a cell which is determined to be outside a reference range of values. Reference ranges of values for characteristics, including, for example, reference ranges of values for refresh, cell write and data retention time characteristics, may be set in accordance with a preference of a user or memory system manufacturer. The BFM 10 enables a fast test regarding memory cell defects not only in an in-field scenario where the memory system 100 is currently in use, but also in a manufacturing factory during manufacture of the memory system 100. The BFM 10 may detect the weak bits and may store weak bit addresses (WBAs) in the NVM 30. The detecting and storing operations may be performed in any one of the factory and the in-field. The NVM 30 may be included in any one of a memory, a buffer chip, a memory module, a logic chip in a three-dimensional (3D) stack, a memory controller, or a central processing unit (CPU).

In addition, when the weak bits are detected in real-time, an address match table may also be updated. When the WBAs are detected by the BFM 10 or a hard error is detected by a host, the WBAs may be added to an address map table in the NVM 30. Also, because data is accessed by the SRAM 20 after the WBAs are replaced, the data may be copied from the DRAM 130 to the SRAM 20. Thus, the SRAM 20 may be referred to as 'data SRAM 20'.

The BFM 10 may change a direct current (DC) bias level of the DRAM 130 and may program user-set test sequences during a product level test. Test sequences of a customized DRAM may be programmed in the NVM 30 by users in the factory after a module is assembled and before the BFM 10 is driven. The pre-programmed test sequences are selectively performed by a built-in self-test (BIST) engine. The BFM 10 may provide a user with allowance with respect to testing various types of test sequences not only in the factory but also in the in-field.

The BFM 10 may include addressing, data pattern definition, a basic test algorithm, a memory DC level control, a user-defined test sequence programming flow, and a weak bit update method. The BFM 10 may program a test pattern that is added by a user after a memory chip is designed. In the factory, a test pattern program may be stored in a test equipment or a personal computer (PC). In the in-field, the test pattern program may be stored in an NVM in a memory module.

Figure 2:
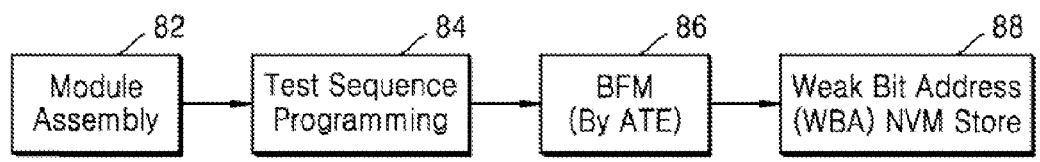
FIG. 2 illustrates a flow of a user program test sequence via a built-in self-test for memory (BFM), according to at least one example embodiment.

FIG. 2 illustrates a flow of a user program test sequence via a BFM, according to at least one example embodiment.

Referring to FIG. 2, after a memory module assembly (operation 82), a test sequence program may be stored in a test equipment, a PC, or the NVM 30 in the buffer chip 110 (operation 84). Afterward, the BFM 10 is driven by an auto test equipment (ATE) (operation 86), and then, WBAs may be stored in the NVM 30 in the buffer chip 110.

Each test sequence may include a plurality of sub-test sequences. For example, 256 sub-test sequences may be programmed in each test sequence. Before each of the sub-test sequences is stored in the NVM 30, a location of a target NVM in which a current test sequence is to be programmed may be selected by a BFM register, e.g., b[30:27] register bits.

The number of sub-test sequences may be defined by b[38:31] register bits in the BFM register. Also, bits of the BFM register may be set to determine a test flow including a memory access control, data patterns, DRAM timings, a DC voltage level, an algorithm, and the like. When all of the bits of the BFM register are set, the BFM register, e.g., bit3 may be set as "1" so as to dump values of the bits to corresponding sequence fields in the NVM 30.

In order to prevent execution of the BFM 10 during a process in which the bits of the BFM register are set, a first bit in the BFM register may maintain "0". When a sub-sequence program is ended, bit3 may be reset as "0". The test flow may be repeated until all of the sub-test sequences are programmed.

Figure 3:
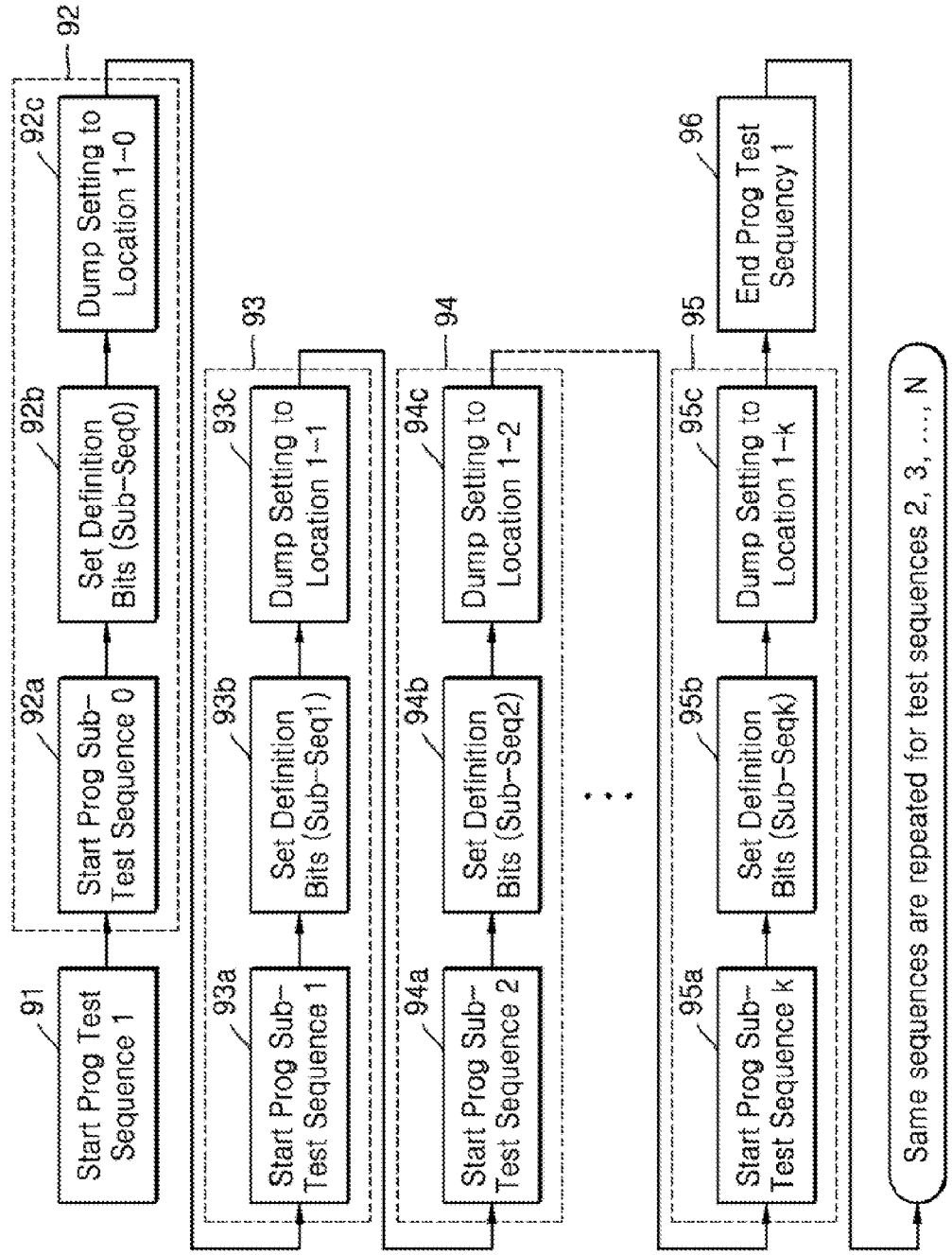
FIG. 3 is a diagram of a test sequence including sub-test sequences using the BFM, according to at least one example embodiment.

FIG. 3 is a diagram of a test sequence including sub-test sequences using the BFM 10, according to at least one example embodiment.

Referring to FIG. 3, the test sequence may start a first test sequence program (operation 91). The first sub-test sequence program may be ended (operation 92) by programming a first sub-test sequence (operation 92a), by setting BFM register bits corresponding to the first sub-test sequence (operation 92b), and by dumping values of the BFM register bits to corresponding sequence fields in an NVM (operation 92c).

The second sub-test sequence program may be ended (operation 93) by programming a second sub-test sequence (operation 93a), by setting BFM register bits corresponding to the second sub-test sequence (operation 93b), and by dumping values of the BFM register bits to corresponding sequence fields in the NVM (operation 93c). Afterward, third sub-test sequence program processes (operations 94, 94a, 94b, and 94c) may be performed, and continuously, $k+1_{th}$ sub-test sequence program processes (operations 95, 95a, 95b, and 95c) may be performed, so that the first test sequence program may be ended (operation 96). Afterward, sub-test sequences of each of second, third, . . . , $N_{th}$ test sequences may be programmed.

During manufacture of a memory module after an assembly of the memory module or during an in-field operation of the memory module, weak cells may be detected by the BFM 10. During the manufacture, the BFM 10 may be driven by an ATE, and error bit addresses may be stored in an on-chip NVM, an in-module NVM, or external storage units of a PC and the ATE. During the in-field operation, the BFM 10 may be driven according to a request by the host 120, and error bit addresses may be stored not only in the NVM 30 but also may be stored in an address map SRAM 20 in the buffer chip 110.

Figure 4:
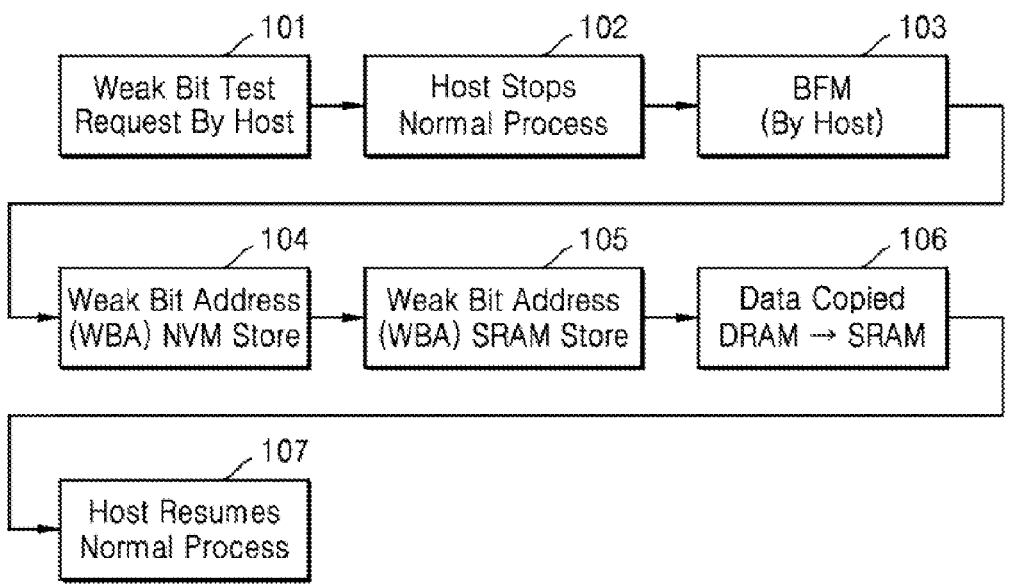
FIG. 4 is a diagram of an in-field diagnosis repair flow by using the BFM, according to at least one example embodiment.

FIG. 4 is a diagram of an in-field diagnosis repair flow by using the BFM 10, according to at least one example embodiment.

Referring to FIG. 4, when a weak bit test is requested by the host 120 (operation 101), the host 120 stops a normal process (operation 102). Then, the BFM 10 is performed by the host 120 (operation 103), and WBAs are stored in the NVM 30 (operation 104) and then, are also stored in the SRAM 20 (operation 105). Afterward, corrected data of corresponding data stored in the DRAM 130 is copied to the data SRAM 20 in the buffer chip 110 (operation 106). All accesses to the WBAs occur in the SRAM 20 in the buffer chip 110, instead of the DRAM 130. The host 120 resumes the normal process which was temporarily stopped until an entire test process is ended (operation 107).

Figure 5:
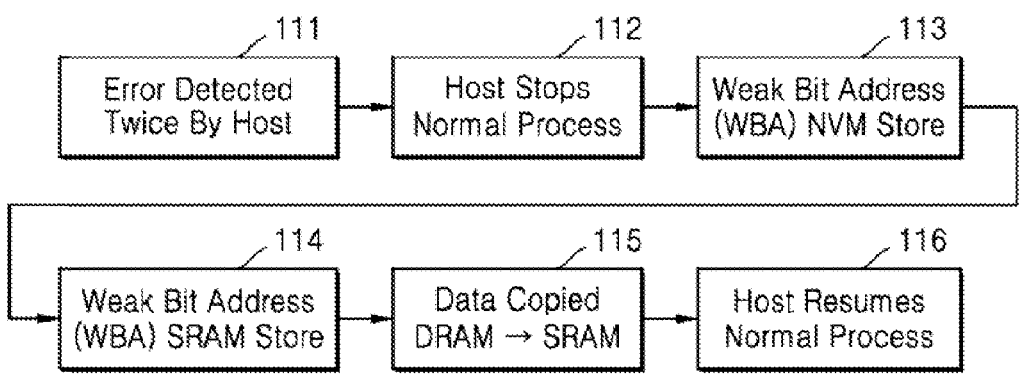
FIG. 5 is a diagram of an in-field request repair using the BFM, according to at least one example embodiment.

FIG. 5 is a diagram of an in-field request repair using the BFM 10, according to at least one example embodiment.

Referring to FIG. 5, in the host 120 having an error checking and correction (ECC) check function, error occurrences may be tracked in real-time. When two errors occur at the same address (operation 111), there is a high possibility that the address has a hard failure. In this case, normal operations may be temporarily stopped (operation 112). The address having the hard failure may be stored in the NVM 30 (operation 113) and then, may also be stored in the SRAM 20 in the buffer chip 110 (operation 114). In this case, the SRAM 20 may be referred to as 'weak bit address map SRAM 20'.

Afterward, corrected data of corresponding data stored in the DRAM 130 is copied to the data SRAM 20 in the buffer chip 110 (operation 115). All accesses to the WBAs occur in the SRAM 20 in the buffer chip 110, instead of the DRAM 130. The host 120 resumes the normal process which was temporarily stopped until an entire test process is ended (operation 116).

Algorithms for an update of the SRAM 20 and the NVM 30 will be described with reference to FIGS. 6 through 8.

During a weak cell screen test, errors may be logged in error log registers. However, because the number of error logs is limited, once the error logs are filled, the error logs may be stored in on-chip NVMs, in-module NVMs, or external storage units in a PC or an ATE. When all of the error log registers are filled, a BIST engine may alert a user to temporarily stop a test process until the error log registers are emptied.

Figure 6:
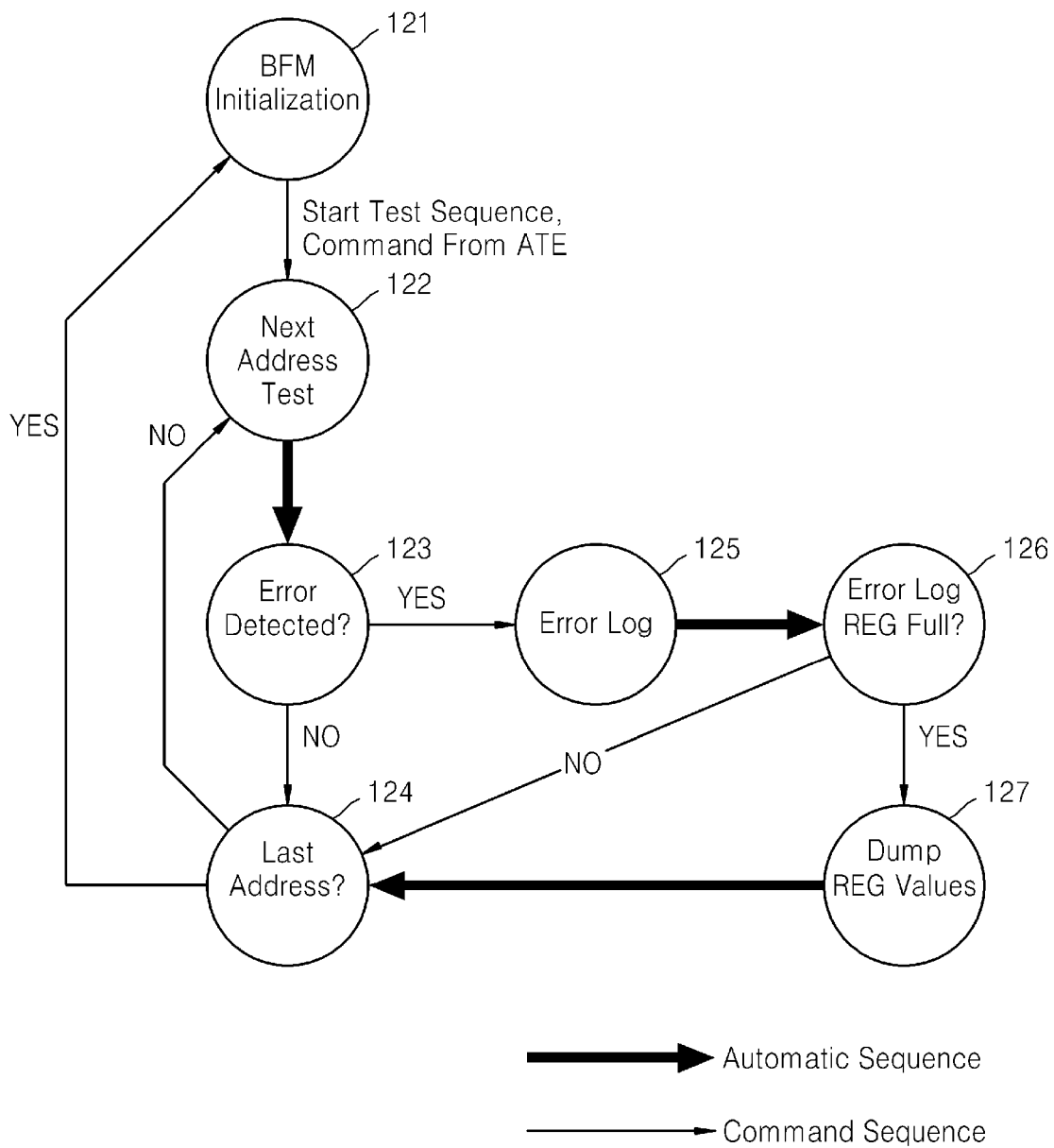
FIG. 6 is a diagram illustrating an error log and storage flow in a factory, according to at least one example embodiment.

FIG. 6 is a diagram illustrating an error log and storage flow in a factory, according to at least one example embodiment.

Referring to FIG. 6, after a power-up, the BFM 10 is initialized (operation 121). When a test sequence start command is issued from an ATE, a test sequence defined in a BFM register is executed. First, a start address is tested (operation 122), and if an error is not detected therefrom (operation 123), it is checked whether this address is a last address (operation 124). If this address is the last address, the BFM 10 is initialized again and enters a wait state so as to receive a next test start command. Otherwise, if this address is not the last address, this loop is repeated until an entire test flow is ended. In the test sequence, a command operation that is an operation performed in response to a command is denoted by a solid line, and an automatic operation is denoted by a bold solid line.

Otherwise, if an error is detected during the test flow (operation 123), a corresponding error address and data are logged in an error log register (operation 125). Whenever an error occurs, it is checked whether all error log registers are filled (operation 126), and the checking operation may be automatically performed. If all error log registers are not filled, the test flow continues. Otherwise, if all of the error log registers are filled, addresses and a plurality of pieces of data stored in the error log registers are dumped to the NVM 30 (operation 127). Afterward, the test flow automatically continues, so that next errors may be stored.

During in-field operations, an address map table and the data SRAM 20 may be updated in real-time by a request from the host 120 using the BFM 10 or by ECC in the host 120. In the former case, when weak bits are detected, addresses of the weak bits may be internally added to the address map table SRAM 20 in the buffer chip 110. In the latter case, when an address of an error bit is detected, the address may be stored in the address map table SRAM 20. Afterward, a data read command with respect to the address may be issued to the DRAM 130, and then, corrected data of corresponding data may be stored in the data SRAM 20.

Figure 7:
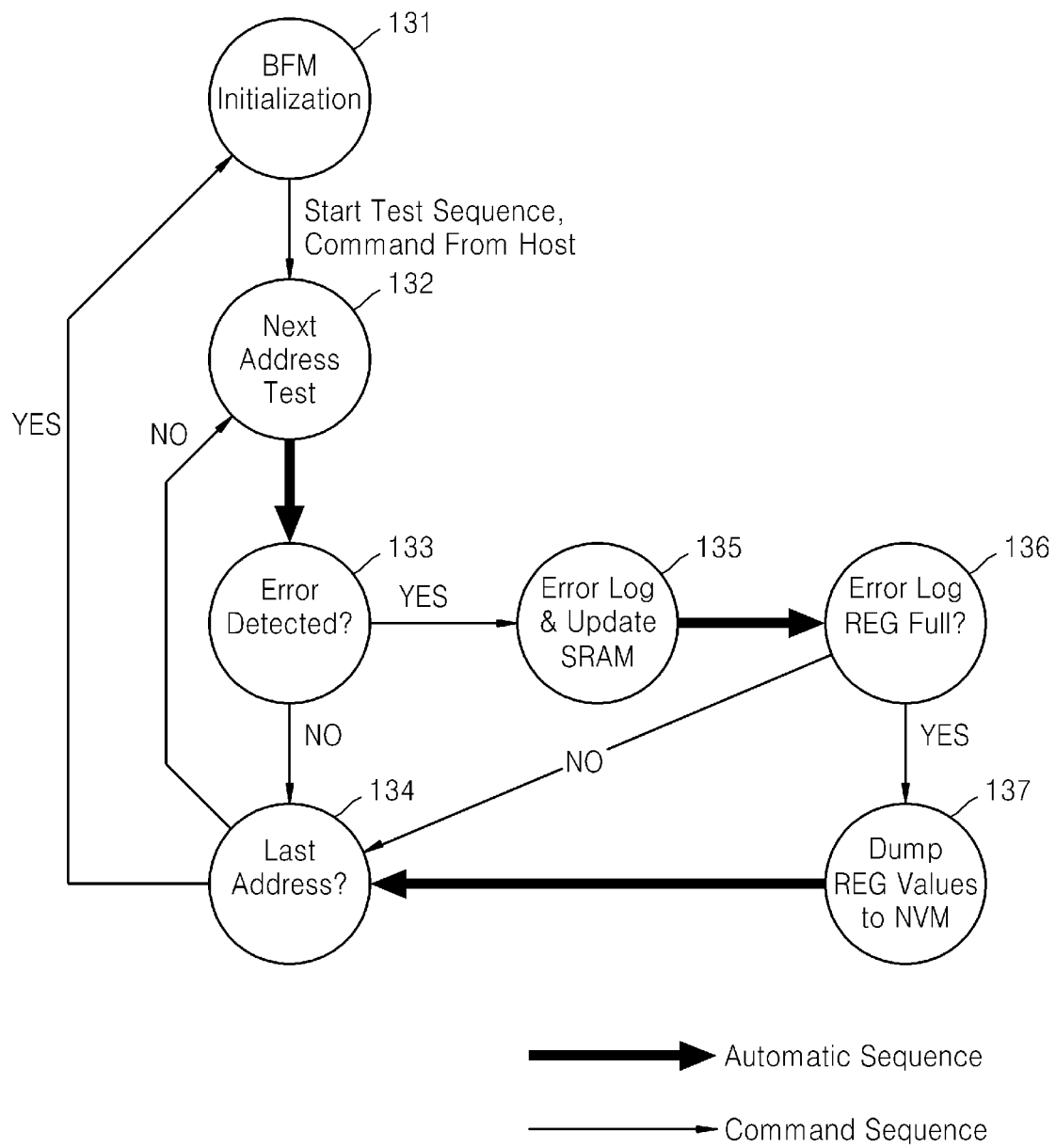
FIG. 7 is a diagram illustrating an error log and storage flow in an in-field diagnosis repair, according to at least one example embodiment.

FIG. 7 is a diagram illustrating an error log and storage flow in an in-field diagnosis repair, according to at least one example embodiment.

Referring to FIG. 7, after a power-up, the BFM 10 is initialized (operation 131). When a test sequence start command is issued from an ATE, a test sequence defined in a BFM register is executed. First, a start address is tested (operation 132), and if an error is not detected therefrom (operation 133), it is checked whether this address is a last address (operation 134). If this address is the last address, the BFM 10 is initialized again and enters a wait state so as to receive a next test start command. Otherwise, if this address is not the last address, this loop is repeated until an entire test flow is ended.

Otherwise, if an error is detected during the test flow (operation 133), a corresponding error address and data are logged in an error log register and are updated in the address map table SRAM 20 (operation 135). Whenever an error occurs, it is checked whether all error log registers are filled (operation 136), and the checking operation may be automatically performed. If all error log registers are not filled, the test flow continues. Otherwise, if all of the error log registers are filled, addresses and a plurality of pieces of data stored in the error log registers are dumped to the NVM 30 (operation 137). Afterward, the test flow automatically continues, so that next errors may be stored.

Figure 8:
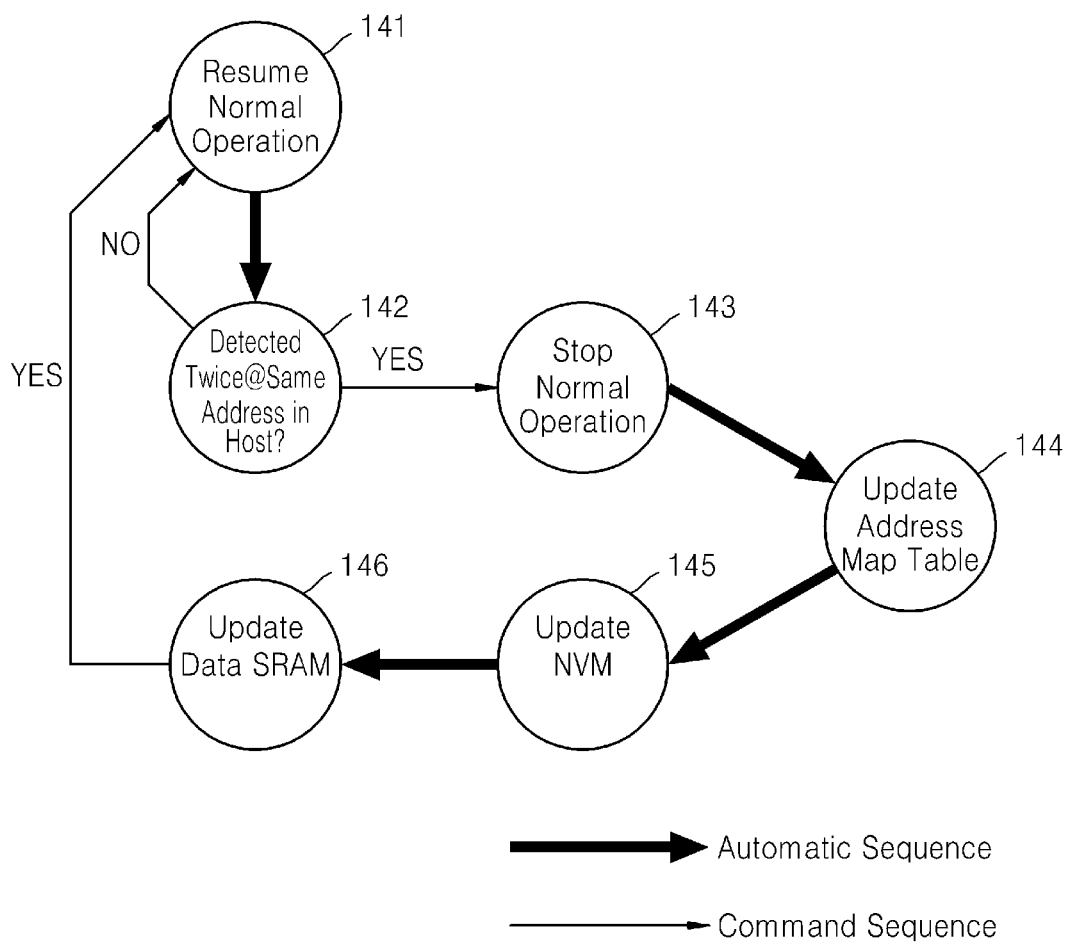
FIG. 8 is a diagram illustrating an error log and storage flow in an in-field request repair, according to at least one example embodiment.

FIG. 8 is a diagram illustrating an error log and storage flow in an in-field request repair, according to at least one example embodiment.

Referring to FIG. 8, the host 120 performs a normal operation (operation 141). When two errors occur at the same address (operation 142), the host 120 temporarily stops the normal operation (operation 143), automatically and continuously updates the address map table SRAM 20 (operation 144), updates the NVM 30 (operation 145), and updates the data SRAM 20 (operation 146). Afterward, when all replacing operations are ended, the host 120 resumes the normal operation (operation 141).

Figure 9:
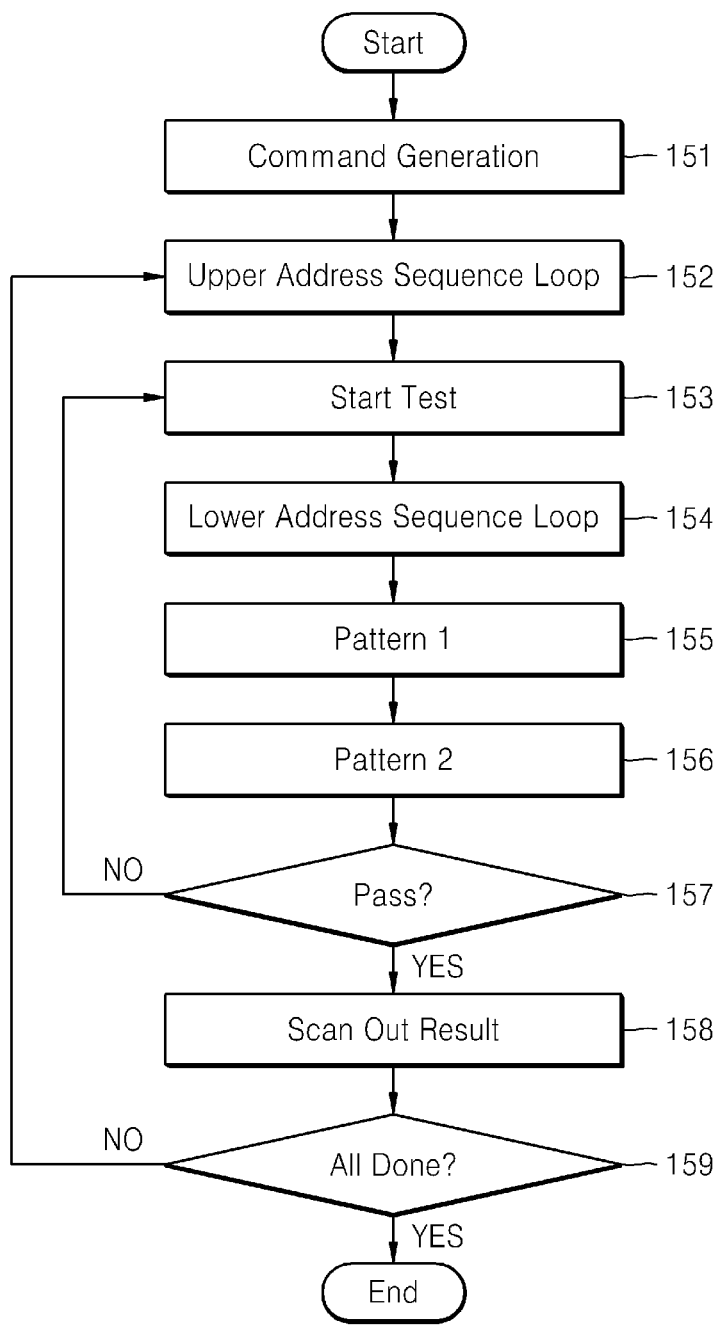
FIG. 9 is a flowchart of a test method by the BFM, according to at least one example embodiment.

FIG. 9 is a flowchart of a test method by the BFM 10, according to at least one example embodiment.

Referring to FIG. 9, in a test, an active-precharge command without a read or write command may be generated (operation 151). Also, a nested address pattern in which a lower address sequence loop (operation 154) exits in an upper address sequence loop (operation 152) may be generated. A test of the upper address sequence loop may start (operation 153) and then, a test of the lower address sequence loop may start (operation 154). When test patterns are applied, the test patterns may be repeated back and forth in two designated rows (operation 155). An active-precharge operation may be repeatedly performed on one row.

When the test of the lower address sequence loop passes (operation 157), a test result may be scanned out (operation 158). The scanned-out test result may be stored according to the error log and storage flows described above with reference to the previous embodiments (refer to FIGS. 6 through 8). When a test of the nested address pattern is completed (operation 159), a BFM test is ended. In the test, the number of no-operation commands (NOPs) between active-precharge commands may be adjusted. Also, a size of a jump in a row direction or a column direction may be programmed.

Figure 10:
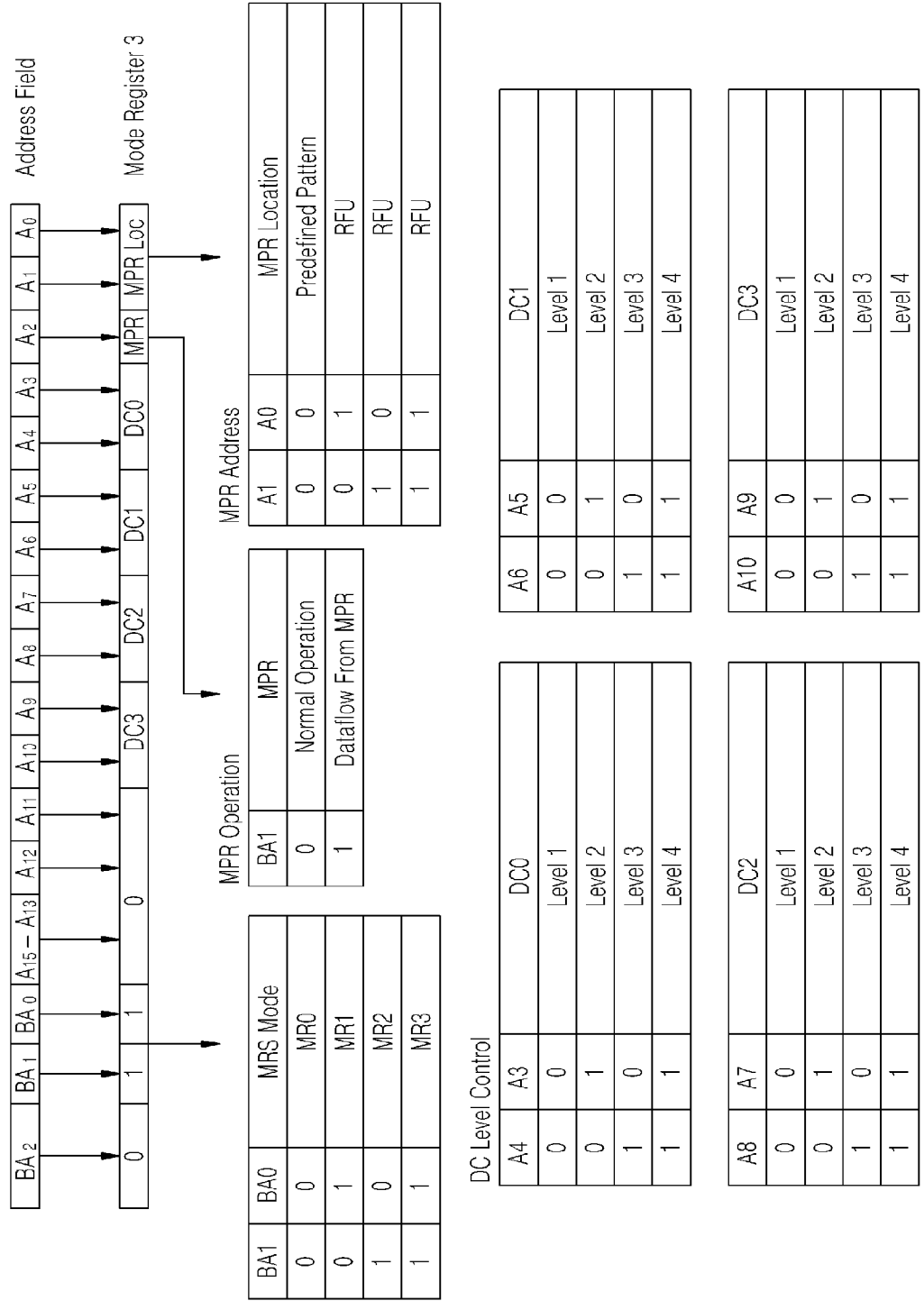
FIG. 10 illustrates a method of controlling an internal direct current (DC) voltage level of the BFM, according to at least one example embodiment.

FIG. 10 illustrates a method of controlling an internal DC voltage level of the BFM 10, according to at least one example embodiment.

Referring to FIG. 10, it is possible to provide a protocol so as to adjust an internal DC voltage level of the DRAM 130 by using a mode register in the DRAM 130. For example, an MR3 mode register may be used. The MR3 mode register may be set to be controlled by the buffer chip 110 or a test equipment. A3 through A10 bits that are linked with the MR3 mode register may be set to control DC levels. The register field bits may be controlled by any one of the test equipment and a user-defined test sequence program.

The A3 and A4 bits may set a first DC level DC0 as four different levels. The A5 and A6 bits may set a second DC level DC1 as four different levels. The A7 and A8 bits may set a third DC level DC2 as four different levels. The A9 and A10 bits may set a fourth DC level DC3 as four different levels. The first through fourth DC levels DC0 through DC3 may be set as a level of a boost voltage VPP, a level of an internal power voltage VINT, a level of a back bias voltage VBB, or a level of a bit line precharge voltage VBL.

The same number of bits may be defined in particular fields in a BFM register. A BFM register bit[48:41] may be set as four types of DCs. Each of the DCs may be set as four different levels. The level setting may be requested to the user-defined test sequence program that changes DC voltage levels when required.

After a power-up, default DC level setting values of the MR3 mode register and a BFM DC register are all "00". Whenever a test sequence is ended, corresponding bits of the MR3 mode register and the BFM DC register may be re-set as "00".

When the MR3 mode register is controlled by the test equipment, corresponding bits of the MR3 mode register may be directly programmed by an ATE. In order to prevent an accidental undesired DC biasing level change during a normal operation, a memory may include a fuse and logic to disable a DC voltage level control function after an entire repair process is ended.

Figure 11:
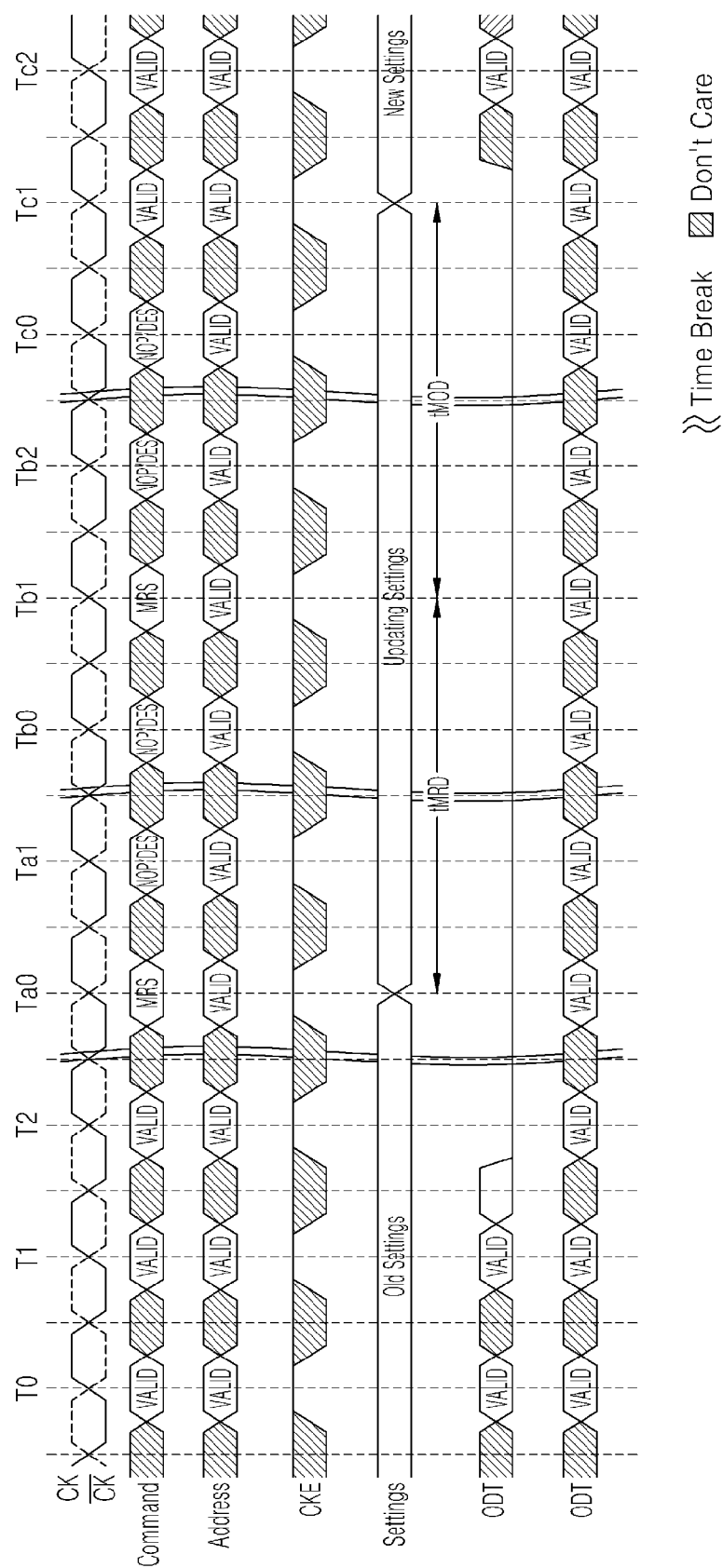
FIG. 11 is a timing diagram of a mode register setting operation of FIG. 10.

FIG. 11 is a timing diagram of a mode register setting operation of FIG. 10.

Referring to FIG. 11, a mode register write operation may be set to be completed during a mode register set command cycle time tMRD, which is a minimum time between MRS commands. The minimum time tMRD may be set between an MRS command and a non-MRS command.

Figure 12:
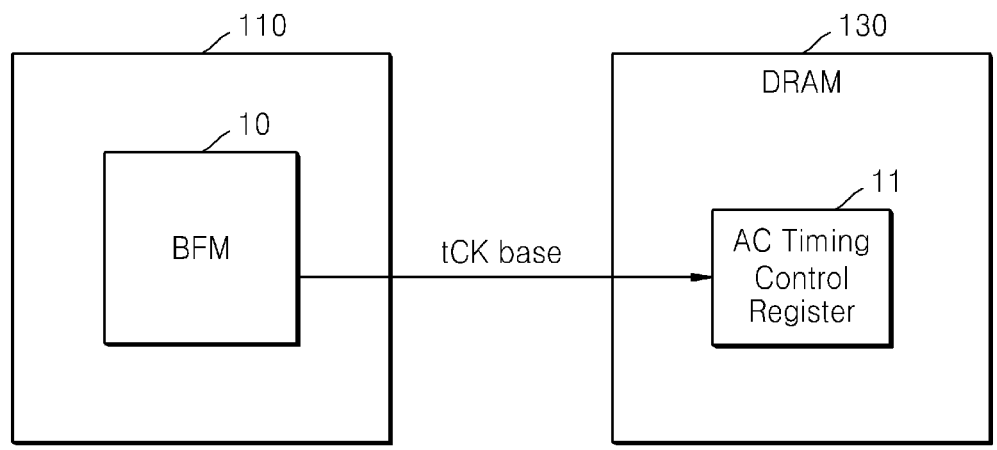
FIG. 12 is a block diagram of a method of controlling internal alternating current (AC) timing of the BFM, according to at least one example embodiment.

FIG. 12 is a diagram of a method of controlling internal alternating current (AC) timing of the BFM 10, according to at least one example embodiment.

Referring to FIG. 12, the BFM 10 may adjust all AC timing parameters with a predetermined or reference resolution. The AC timing parameters may include tRAS, tRP, tRCD, tWR, tREF, tPAUSE, and the like. The AC timing may be adjusted based on a system clock period tCK in the buffer chip 110 (refer to FIG. 1). Also, in the DRAM 130 (refer to FIG. 1), a protocol may be arranged between the DRAM 130 and the buffer chip 110, so that an AC timing resolution may be accurately adjusted.

An AC timing control register 11 in the DRAM 130 may be controlled by the buffer chip 110 or a test equipment. In one test sequence, AC timing of a cell that is accessed to cause stress and AC timing of a cell that is accessed for a test-free condition may be differentially applied.

When the DRAM 130 is tested by using an ATE, a WBA may occur and thus may be stored in an NVM in the DRAM 130 or may be stored in the NVM 30.

Figure 13:
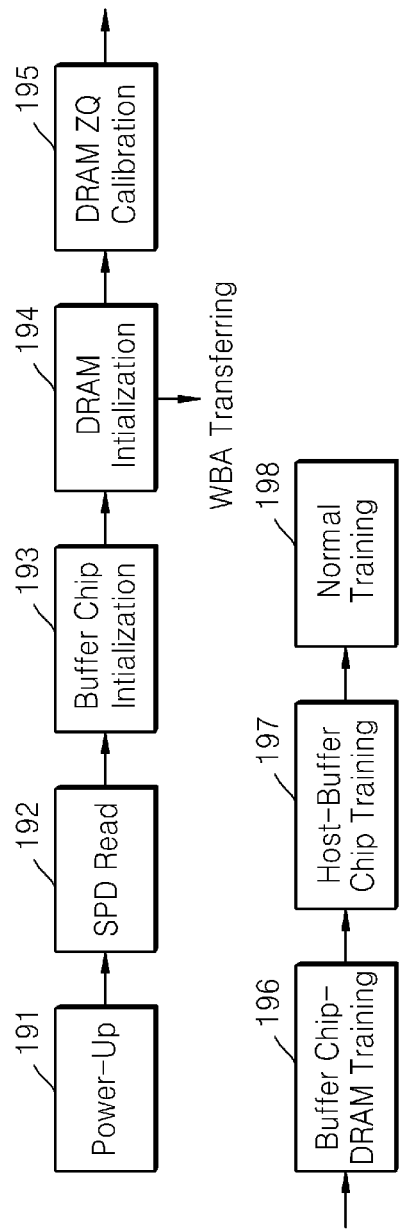
FIGS. 13 and 14 illustrate a flow and timing of a weak bit address (WBA) transfer using an auto test equipment (ATE), according to at least one example embodiment.
Figure 14:
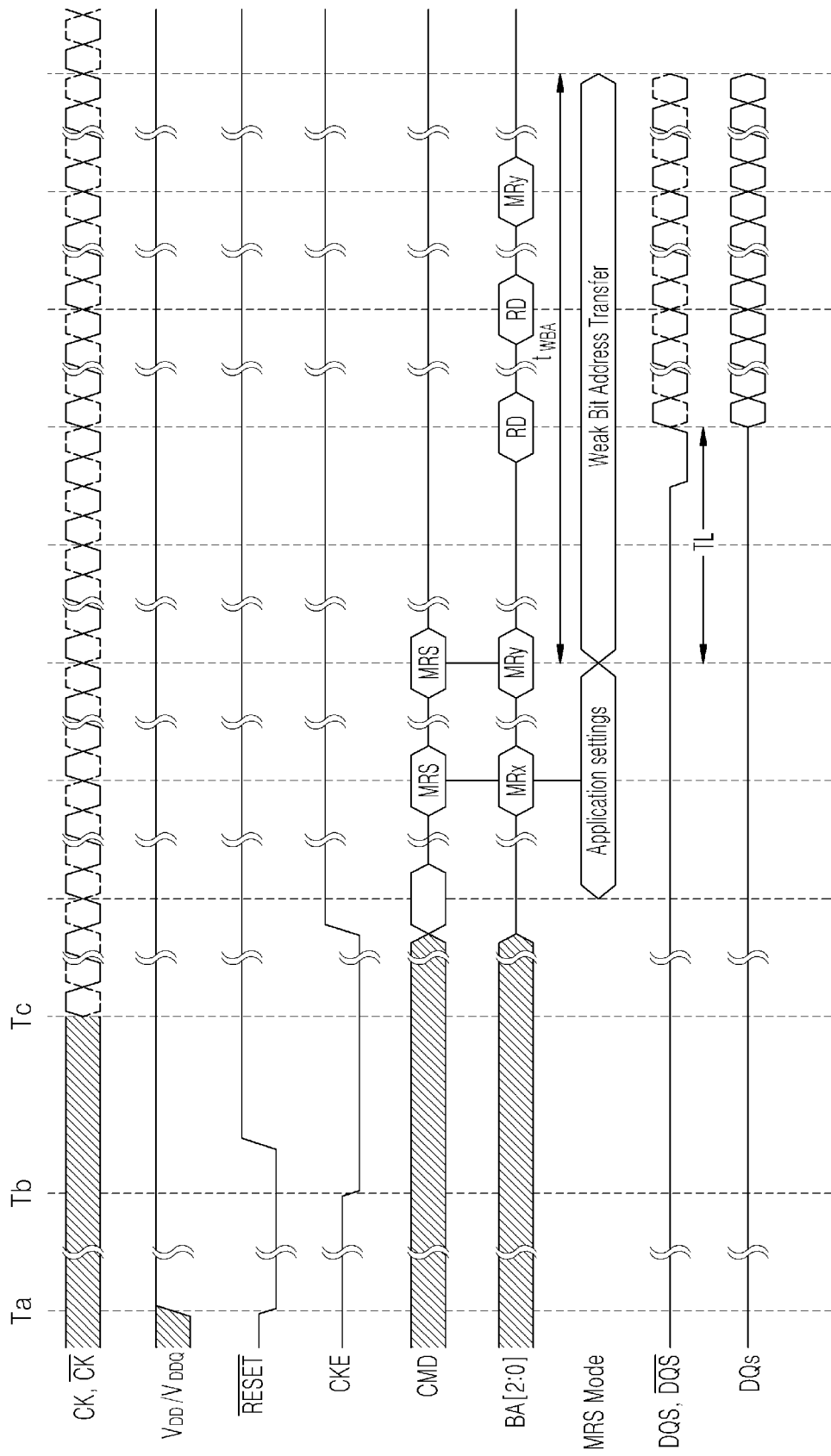

FIGS. 13 and 14 illustrate a flow and timing of a WBA transfer using an ATE, according to at least one example embodiment.

Referring to FIG. 13, in the WBA transfer flow, after a power-up (operation 191), serial presence detect (SPD), which is individual memory information, is read (operation 192). The SPD may be formed as an NVM (e.g., an electrically erasable programmable read-only memory (EE-PROM)). Information regarding semiconductor memory devices mounted in a memory module, when a memory interface is designed, may be recorded to the SPD, and examples of the information include the number of row and column addresses, a data width, the number of ranks, a memory density for each rank, the number of semiconductor memory devices, a memory density for each semiconductor memory device, and the like. When a memory system is initialized, memory module information Module_info may be provided from the SPD to a memory controller.

The buffer chip 110 is initialized (operation 193), and the DRAM 130 is initialized (operation 194). When the DRAM 130 is initialized, WBAs that occur during an ATE test may be stored in an NVM in the DRAM 130. Afterward, ZQ calibration is performed (operation 195), DRAM training in the buffer chip 110 is performed (operation 196), buffer chip training by the host 120 is performed (operation 197), and then, normal training is performed (operation 198).

A WBA transfer mode that uses a mode purpose register (MPR) function may be initialized in response to a mode register set (MRS) command after required contents of mode registers for all application settings are fully initialized. In the WBA transfer mode, detection of WBAs in the NVM in the DRAM 130 may be performed with a fixed burst length and a back-to-back read mode order. The number of MPR read commands issued by the host 120 is a predefined value that depends on the maximum number of the WBAs, a data width, the number of ranks, and the burst length.

The effective number of WBAs of the DRAM 130 may be transferred with a last WBA via all data input/output signals (DQs). The transfer of the WBAs may be performed in a rank-by-rank manner, and thus, a total transfer time of the WBAs may be calculated as tWBA. As illustrated in FIG. 14, tWBA may be determined as "transfer latency (TL)+the number of WBAs for each rank*the number of ranks". The TL may have a predetermined or reference fixed value and may be programmed by the host 120.

Figure 15:
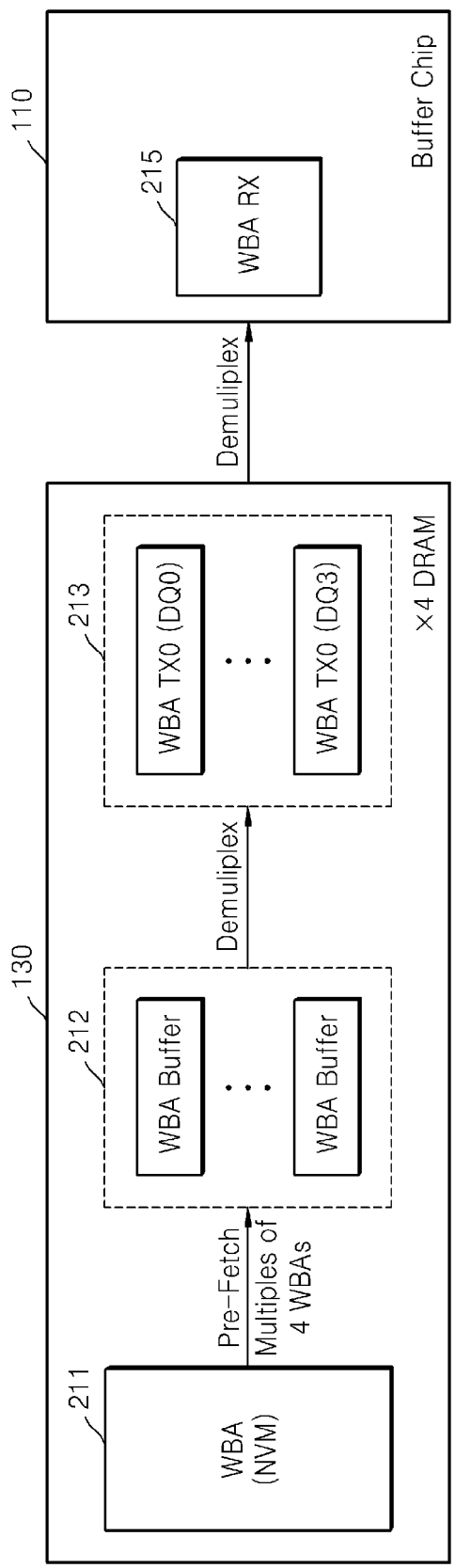
FIG. 15 is a diagram illustrating a WBA transfer to a buffer chip, according to at least one example embodiment.

FIG. 15 is a diagram illustrating a WBA transfer to the buffer chip 110, according to at least one example embodiment.

FIG. 15 illustrates the WBA transfer between the DRAM 130 and the buffer chip 110. The DRAM 130 may include a NVM 211, a WBA buffer unit 212, and a WBA transfer unit 213. The NVM 211 may be formed as an anti-fuse that is programmed according to a WBA. The WBA buffer unit 212 may pre-fetch WBAs from the NVM 211, wherein the WBAs correspond to multiples of 4 according to ×4 DRAM architecture.

The WBA transfer unit 213 may transfer the WBAs that are pre-fetched to the WBA buffer unit 212 to DQs. The WBA transfer unit 213 may transfer the WBAs to the buffer chip 110 in a pipeline manner. The buffer chip 110 may include a WBA receiving unit 215 that receives the WBAs transferred from the DRAM 130. Also, the WBA receiving unit 215 may receive MPR values that are read from the DRAM 130.

A transfer rate with respect to the WBA transfer to the buffer chip 110 may be increased by pre-fetching the WBAs to the WBA buffer unit 212, which are multiples of 4 (×4 DRAM) or 8 (×8 DRAM), and pipelining the buffered WBAs by demultiplexing.

FIG. 16 illustrates WBA fields of the BFM 10, according to at least one example embodiment.

Referring to FIG. 16, the WBA fields may be configured of bank addresses, row addresses, and column addresses. A range of the WBA fields may be determined by a chip capacity of the DRAM 130. In a case of a 2 Gb (=512 Mb*4) DRAM, the bank addresses may be allocated to WBA[2:0] bits, the column addresses may be allocated to WBA[13:3] bits, and the row addresses may be allocated to WBA[28:14] bits. In a case of a 2 Gb (=512 Mb*8) DRAM, the bank addresses may be allocated to WBA[2:0] bits, the column addresses may be allocated to WBA[12:3] bits, and the row addresses may be allocated to WBA[27:13] bits.

In a case of a 4 Gb (=1 G*4) DRAM, the bank addresses may be allocated to WBA[2:0] bits, the column addresses may be allocated to WBA[13:3] bits, and the row addresses may be allocated to WBA[29:14] bits. In a case of a 4 G (=512 Mb*8) DRAM, the bank addresses may be allocated to WBA

[2:0] bits, the column addresses may be allocated to WBA [12:3] bits, and the row addresses may be allocated to WBA [28:13] bits.

FIGS. 17 through 20 illustrate mapping between WBAs and DQs in the BFM 10, according to at least one example embodiment.

FIG. 17 illustrates a first example of DQ mapping based on 2 Gb (=512 Mb*4) DRAM rank(×72). WBA0[28:0] bits of a first WBA WBA0 may be mapped to DQ0[28:0]. The WBA0[0] bit may be mapped to a first clocking DQ0[0] of the DQ0, the WBA0[1] bit may be mapped to a second clocking DQ0[1] of the DQ0, the WBA0[2] bit may be mapped to a third clocking DQ0[2] of the DQ0, and the WBA0[3] bit may be mapped to a fourth clocking DQ0[3] of the DQ0. After the rest of the WBA0 bits are mapped to the DQ0 according to sequential clocking operations, the WBA0[28] bit may be mapped to a $29^{th}$ clocking DQ0[28] of the DQ0.

WBA1[28:0] bits of a second WBA WBA1 may be mapped to DQ0[57:29]. The WBA1[0] bit may be mapped to a $30^{th}$ clocking DQ0[29] of the DQ0, the WBA1[1] bit may be mapped to a $31^{st}$ clocking DQ0[30] of the DQ0, the WBA1[2] bit may be mapped to a $32^{nd}$ clocking DQ0[31] of the DQ0, and the WBA1[3] bit may be mapped to a $33^{rd}$ clocking DQ0[32] of the DQ0. After the rest of the WBA0 bits are mapped to the DQ0 according to sequential clocking operations, the WBA1[28] bit may be mapped to a $58^{th}$ clocking DQ0[57] of the DQ0.

In this manner, third through $k_{th}$ WBAs WBA2 through WBAk−1 are mapped to the DQ0 according to sequential clocking operations. Last effective WBAs WBAk[28:0] may be mapped to DQ0[29k+28:29k]. That is, the WBAk[0] bit may be mapped to the 29k+$1^{st}$ clocking DQ0[29k] of the DQ0, the WBAk[1] bit may be mapped to the 29k+$2^{nd}$ clocking DQ0[29k+1] of the DQ0, the WBAk[2] bit may be mapped to the 29k+$3^{rd}$ clocking DQ0[29k+2] of the DQ0, and the WBAk[3] bit may be mapped to the 29k+$4^{th}$ clocking DQ0[29k+3] of the DQ0. After the rest of the WBAk bits are mapped to the DQ0 according to sequential clocking operations, the WBAk[28] bit may be mapped to the 29k+$29^{th}$ clocking DQ0[29k+28] of the DQ0.

FIG. 18 illustrates a second example of the DQ mapping based on 2 Gb (=512 Mb*4) DRAM rank(×72). WBA0[28:0] bits of a first WBA WBA0 may be mapped to DQ0[28:0]. The first bit WBA0[0] of the WBA0 may be mapped to a first clocking DQ0[0] of the DQ0, the second bit WBA0[1] of the WBA0 may be mapped to a second clocking DQ0[1] of the DQ0, the third bit WBA0[2] of the WBA0 may be mapped to a third clocking DQ0[2] of the DQ0, and the fourth bit WBA0[3] of the WBA0 may be mapped to a fourth clocking DQ0[3] of the DQ0. After the rest of the WBA0 bits are mapped to the DQ0 according to sequential clocking operations, the WBA0[28] bit may be mapped to a $29^{th}$ clocking DQ0[28] of the DQ0.

WBA1[28:0] bits of a second WBA WBA1 may be mapped to DQ1[28:0]. The WBA1[0] bit may be mapped to a first clocking DQ1[0] of the DQ1, the WBA1[1] bit may be mapped to a second clocking DQ1[1] of the DQ1, the WBA1[2] bit may be mapped to a third clocking DQ1[2] of the DQ1, and the WBA1[3] bit may be mapped to a fourth clocking DQ1[3] of the DQ1. After the rest of the WBA1 bits are mapped to the DQ1 according to sequential clocking operations, the WBA1[28] bit may be mapped to a $29^{th}$ clocking DQ1[28] of the DQ1.

WBA2[28:0] bits of a third WBA WBA2 may be mapped to DQ2[28:0]. The WBA2[0] bit may be mapped to a first clocking DQ2[0] of the DQ2, the WBA2[1] bit may be mapped to a second clocking DQ2[1] of the DQ2, the WBA2[2] bit may be mapped to a third clocking DQ2[2] of the DQ2, and the WBA2[3] bit may be mapped to a fourth clocking DQ2[3] of the DQ2. After the rest of the WBA2 bits are mapped to the DQ2 according to sequential clocking operations, the WBA2[28] bit may be mapped to a $29^{th}$ clocking DQ2[28] of the DQ2.

WBA3[28:0] bits of a fourth WBA WBA3 may be mapped to DQ3[28:0]. The WBA3[0] bit may be mapped to a first clocking DQ3[0] of the DQ3, the WBA3[1] bit may be mapped to a second clocking DQ3[1] of the DQ3, the WBA3[2] bit may be mapped to a third clocking DQ3[2] of the DQ3, and the WBA3[3] bit may be mapped to a fourth clocking DQ3[3] of the DQ3. After the rest of the WBA3 bits are mapped to the DQ3 according to sequential clocking operations, the WBA3[28] bit may be mapped to a $29^{th}$ clocking DQ3[28] of the DQ3.

The first through fourth WBAs WBA0[28:0]~WBA3[28:0] may be simultaneously mapped to the DQ0[28:0] through DQ3[28:0], respectively, according to sequential first through $29^{th}$ clocking operations. Fifth through eighth WBAs WBA4[28:0] through WBA7[28:0] may be simultaneously mapped to DQ0[57:29] through DQ3[57:29], respectively, according to sequential $30^{th}$ through $58^{th}$ clocking operations.

In this manner, the WBAk−4[28:0] through WBAk−1[28:0]) bits may be simultaneously mapped to the DQ0[29(k−1)+28:29(k−1)] through DQ3[29(k−1)+28:29(k−1)], respectively, according to sequential clocking operations. Last effective WBA bits WBAk[28:0] may be mapped to DQ0[29k+28:29k] according to sequential clocking operations.

FIG. 19 illustrates a third example of the DQ mapping based on 2 Gb (=512 Mb*4) DRAM rank(×72). WBA0[27:0] bits of a first WBA WBA0 may be mapped to DQ0[27:0] according to sequential clocking operations. WBA1[27:0] bits of a second WBA WBA1 may be mapped to DQ0[56:28] according to sequential clocking operations. In this manner, third through $k_{th}$ WBA bits WBA2[27:0] through WBAk−1[27:0] may be mapped to the DQ0 according to sequential clocking operations. Last effective WBAs WBAk[27:0] may be mapped to DQ0[28k+27:28k] according to sequential clocking operations.

FIG. 20 illustrates a fourth example of the DQ mapping based on 2 Gb (=512 Mb*4) DRAM rank(×72). WBA0[27:0] bits of a first WBA WBA0 may be mapped to DQ0[27:0] according to sequential clocking operations, WBA1[27:0] bits of a second WBA WBA1 may be mapped to DQ1[27:0], WBA2[27:0] bits of a third WBA WBA2 may be mapped to DQ2[27:0], and WBA3[27:0] bits of a fourth WBA WBA3 may be mapped to DQ3[27:0]. Fifth through eighth WBAs WBA4[27:0] through WBA7[27:0] may be mapped to DQ4[27:0] through DQ7[27:0], respectively, according to sequential clocking operations. That is, the first through eighth WBAs WBA0[27:0] through WBA7[27:0] may be simultaneously mapped to the DQ0[27:0] through DQ7[27:0], respectively, according to sequential clocking operations.

In this manner, WBAk−8[27:0] through WBAk−1[27:0] bits may be simultaneously mapped to DQ0[28(k−1)+27:28(k−1)] through DQ7[28(k−1)+27:28(k−1)], respectively, according to sequential clocking operations. Last effective WBAs WBAk[27:0] may be mapped to DQ0[28k+27:28k] according to sequential clocking operations.

Figure 21:
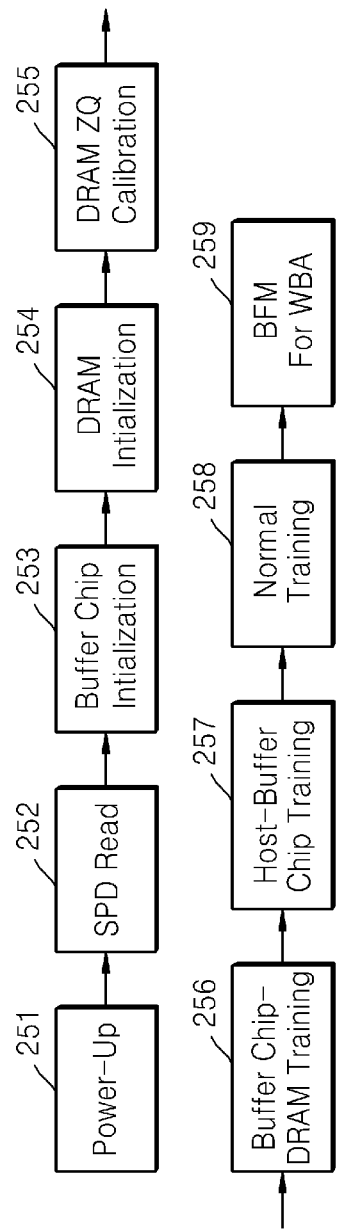
FIG. 21 illustrates a WBA generation flow by using the BFM, according to at least one example embodiment.

FIG. 21 illustrates a WBA generation flow by using the BFM 10, according to at least one example embodiment.

Referring to FIG. 21, WBAs may be generated by using the BFM 10, and the WBAs may be stored in a WBA table SRAM 20b in the buffer chip 110. The WBA generation flow using the BFM 10 reads SPD (operation 252) after a power-up (operation 251). Afterward, the buffer chip 110 is initialized (operation 253), and the DRAM 130 is initialized (operation 254).

ZQ calibration is performed by the DRAM 130 (operation 255), DRAM training is performed by the buffer chip 110 (operation 256), buffer chip training is performed by the host 120 (operation 257), and then, normal training is performed (operation 258). Afterward, the WBAs may be generated by the BFM 10 of the buffer chip 110 (operation 259).

Figure 22:
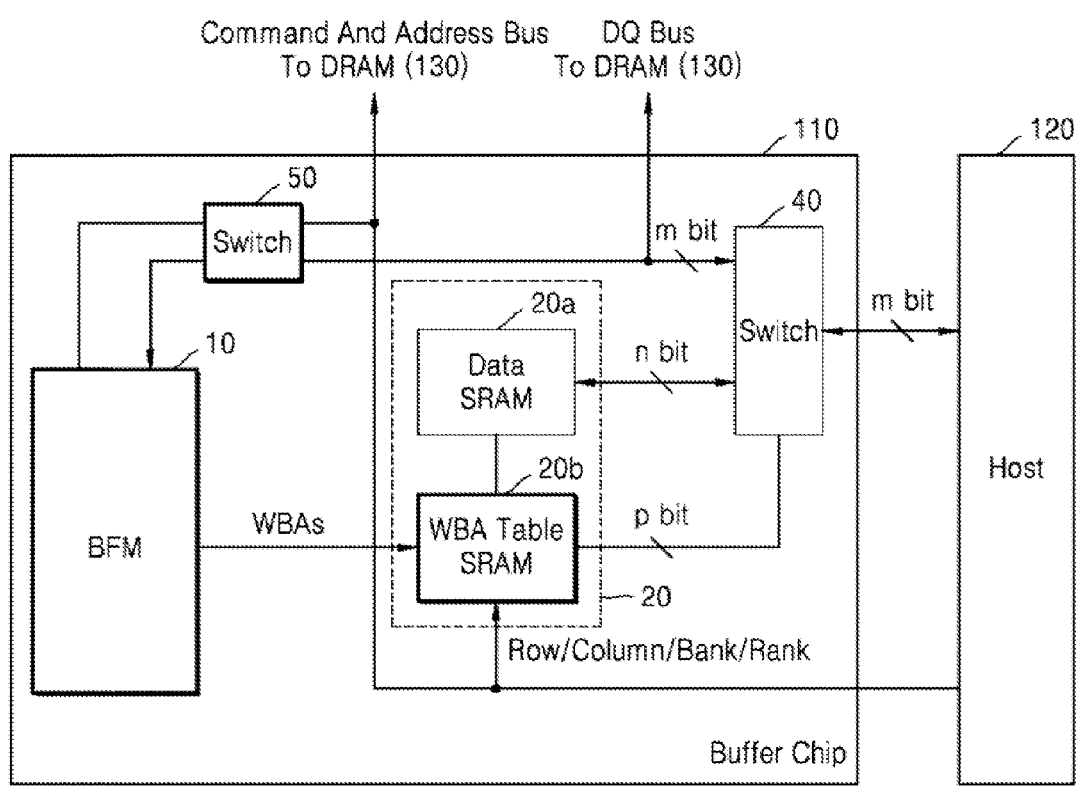
FIG. 22 is a diagram illustrating the buffer chip that transfers WBAs generated by using the BFM, according to at least one example embodiment.

FIG. 22 is a diagram illustrating the buffer chip 110 that transfers WBAs generated by using the BFM 10, according to at least one example embodiment.

Referring to FIG. 22, the buffer chip 110 may include the BFM 10, the SRAM 20, a first switch 40, and a second switch 50. In a test, a command and address bus, and a DQ bus may be connected to the BFM 10 via the second switch 50. When the WBAs are detected by the BFM 10, the BFM 10 may store the WBAs in the WBA table SRAM 20b in the SRAM 20.

Also, the BFM 10 may store data in the WBA table SRAM 20b, wherein the data is stored in the DRAM 130 and corresponds to the WBA. Afterward, all accesses by the host 120 with respect to the WBAs may occur in the SRAM 20 in the buffer chip 110 via the first switch 40, instead of the DRAM 130.

Figure 23:
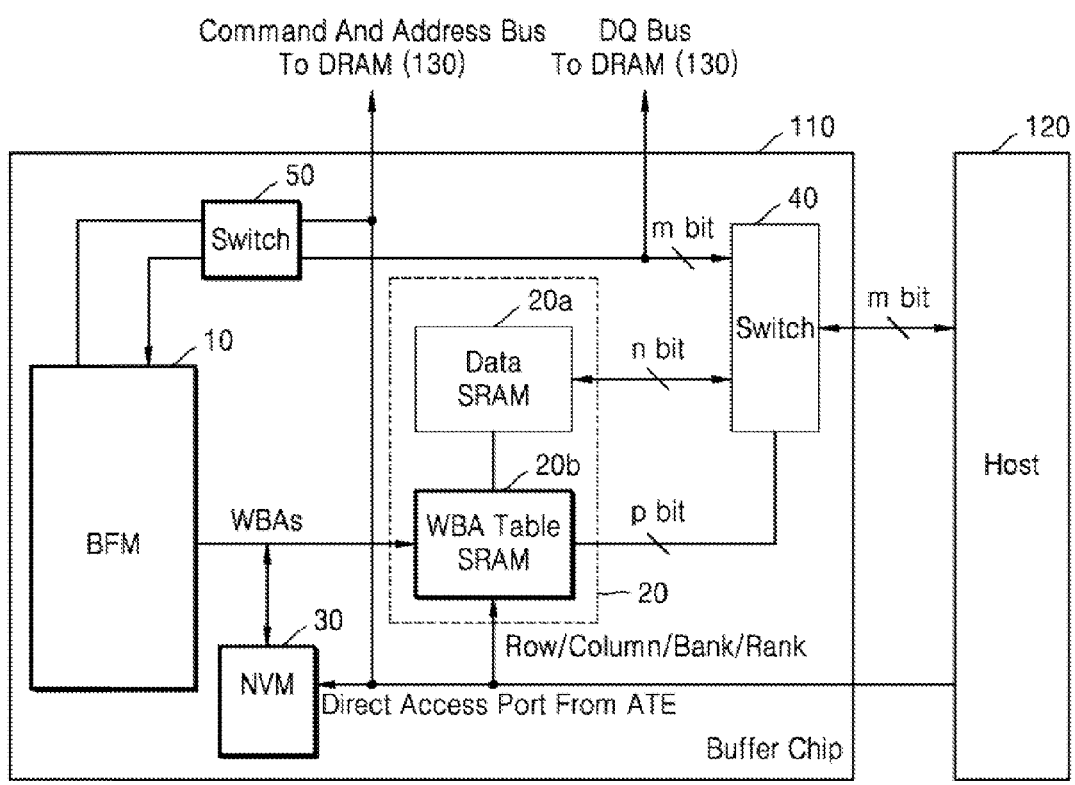
FIG. 23 is a diagram illustrating the buffer chip that transfers WBAs generated by using the BFM, according to at least one example embodiment.

FIG. 23 is a diagram illustrating the buffer chip 110 that transfers WBAs generated by using the BFM 10, according to at least one example embodiment.

Referring to FIG. 23, in a test, a command and address bus, and a DQ bus may be connected to the BFM 10 via the second switch 50. When the WBAs are detected by the BFM 10, the BFM 10 may update the WBAs in the WBA table SRAM 20b in the SRAM 20, and the NVM 30. Also, the BFM 10 may update data in the WBA table SRAM 20b, wherein the data is stored in the DRAM 130 and corresponds to the WBA.

An operation to update a WBA table in the WBA table SRAM 20b and the NVM 30 may be performed during initialization of the DRAM 130 or an in-field operation. Afterward, all accesses by the host 120 with respect to the WBAs may occur in the SRAM 20 in the buffer chip 110 via the first switch 40, instead of the DRAM 130.

The WBA table may store row addresses, column addresses, bank addresses, and rank addresses. The total number of addresses of WBAs in the WBA table may be calculated by "the number of WBAs for each rank (ENmax) *the number of ranks". A format of the WBA table and the data SRAM 20 may be determined by data replacement granularity (DRG).

The DRG may be based on one rank. A capacity of the WBA table may be determined according to the number of repairable WBAs, a combination of field lengths of the repairable WBAs, and the DRG. Because the WBAs are transferred in a fixed rank order such as "rank0→rank1→rank2→rank3", the WBAs may be automatically sorted in each rank.

FIGS. 24 through 26 illustrate formats of the WBA table and the data SRAM 20, according to at least one example embodiment.

A rank-based WBA table may store row addresses, column addresses, and bank addresses. In this case, DQ address fields do not exist. Also, a switch control bit (SCB) is one bit that indicates match or no-match which is a comparison result between host requesting addresses and the WBAs. A plurality of pieces of data corresponding to the WBAs may be DQ mapped by using the same format shown in FIG. 25 and may be stored in the data SRAM 20.

If the DRG is smaller than a rank data width based on a ×4 chip or a ×8 chip, the WBA table may include DQ addresses.

As illustrated in FIG. 26, the WBA table and the SCB may be separately used or may be combined. The combination of the DRQ and the SCB may determine a capacity of the WBA table and the data SRAM 20.

The DRG may be determined by a bit unit, a chip unit, a chip group unit, or a rank unit. As a size of the DRG is decreased, the capacity of the WBA table is increased. The SCB related to the DRG may be directly mapped to a DRAM chip, or the DRAM chip may be selected by encoding the SCB.

FIG. 27 illustrates an SCB mapping operation according to at least one example embodiment. Referring to FIG. 27, DQs of 4 rank of ×4 based module may be mapped by using SCB[17:0] bits. For example, a first bit that is allocated to the rightmost location of the SCB may be mapped to DQ0 through DQ3, and a second bit may be mapped to DQ4 through DQ7. An $18^{th}$ bit that is allocated to the leftmost location of the SCB may be mapped to DQ68 through DQ71, and a $17^{th}$ bit may be mapped to DQ64 through DQ67. Because the second bit and the $18^{th}$ bit are set as "1", the mapped DQ4 through DQ7 and DQ68 through DQ71 may be switched to the SRAM 20.

Alternatively, DRAM chips may be selected by encoding SCB[4:0] bits. When the SCB[4:0] bits are set as "00000", DQ0 through DQ3 may be mapped, and when the SCB[4:0] bits are set as "00001", DQ4 through DQ7 may be mapped. Also, when the SCB[4:0] bits are set as "10000", DQ64 through DQ67 may be mapped, and when the SCB[4:0] bits are set as "10001", DQ68 through DQ71 may be mapped.

FIGS. 28 and 29 illustrate a capacity of a WBA table and the data SRAM 20 according to combinations of the DRQ and the SCB.

Referring to FIG. 28, in a ×8 rank-based case, it is assumed that the SCB is set as 1 bit, the DRG is set as ×72, and the number of WBAs for each DRAM chip is 1024. The number of SCB+DRG bits is 1+72=73. A WBA that includes a row address, a column address, and a bank address corresponds to WBA[27:0] and is 28 bits. Accordingly, the WBA table for each rank is required to have a capacity of 28×9×1024=252K. Also, the data SRAM 20 for each rank is required to have a capacity of 73×1024=73K. Thus, for every 4 ranks, a WBA table SRAM having a capacity of 252K×4≈1 M is required and the data SRAM 20 having a capacity of 73K×4=292K is required.

In a ×4 rank-based case, it is assumed that the SCB is set as 1 bit, the DRG is set as ×72, and the number of WBAs for each DRAM chip is 1024. The number of SCB+DRG bits is 1+72=73. A WBA that includes a row address, a column address, and a bank address corresponds to WBA[28:0] and is 29 bits. Accordingly, the WBA table for each rank is required to have a capacity of 29×9×1024=522K. Also, the data SRAM 20 for each rank is required to have a capacity of 73×1024=73K. Thus, for every 4 ranks, a WBA table SRAM having a capacity of 522K×4≈2 M is required and the data SRAM 20 having a capacity of 73K×4=292K is required.

Referring to FIG. 29, in a ×8 chip-based case, it is assumed that the SCB is set as 9 bits, the DRG is set as ×8, and the number of WBAs for each DRAM chip is 1024. The number of SCB+DRG bits is 9+8=17. A WBA that includes a row address, a column address, and a bank address corresponds to WBA[27:0] and is 28 bits. Accordingly, the WBA table for each rank is required to have a capacity of 28×9×1024=252K. Also, the data SRAM 20 for each rank is required to have a capacity of 17×1024=17K. Thus, for every 4 ranks, a WBA table SRAM having a capacity of 252K×4≈1 M is required and the data SRAM 20 having a capacity of 17K×4=68K is required.

In a ×4 chip-based case, it is assumed that the SCB is set as 18 bits, the DRG is set as ×4, and the number of WBAs for each DRAM chip is 1024. The number of SCB+DRG bits is 18+4=22. A WBA that includes a row address, a column address, and a bank address corresponds to WBA[28:0] and is 29 bits. Accordingly, the WBA table for each rank is required to have a capacity of 29×9×1024=522K. Also, the data SRAM 20 for each rank is required to have a capacity of 22×1024=22K. Thus, for every 4 ranks, a WBA table SRAM having a capacity of 522K×4≈2 M is required and the data SRAM 20 having a capacity of 22K×4=88K is required.

Comparison operations for WBA matches may be performed in ranks, respectively, according to the WBA table.

Figure 30:
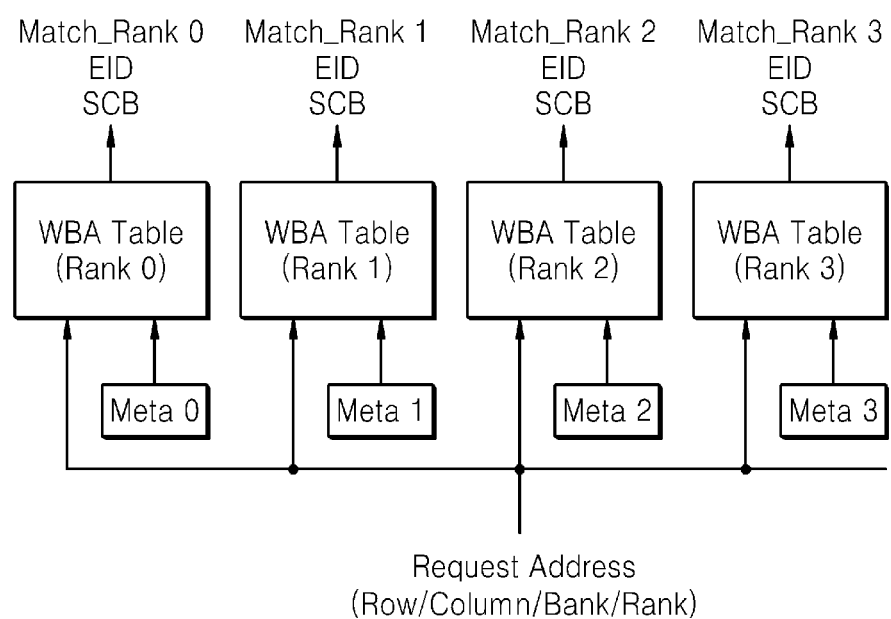
FIG. 30 illustrates parallel comparisons of rank-based WBAs, according to at least one example embodiment.

FIG. 30 illustrates parallel comparisons of rank-based WBAs, according to at least one example embodiment.

Referring to FIG. 30, ranks may perform comparison operations in a parallel manner so as to reduce an address matching time. The rank-based WBAs may be associated with metatables and may be used to set an address match calculation mode. The metatables may consist of the effective number of WBAs and a range of WBA fields, and may be stored in the NVM 30. Hereinafter, in the specification, the NVM 30 may also be referred to as 'metatable 30'.

When WBAs are generated by using an ATE, the effective number of WBAs may be transferred via additional WBA transfer cycles or may be stored in the NVM 30 during a product test. The WBAs that are stored in the NVM 30 may consist of metatables and may be stored in the WBA table SRAM 20 during a power-up. SCBs may be dedicatedly allocated to DQs of a DRAM chip. In this case, the SCBs may be used to identify multiple nibble-wide DQs to replace.

When the SCB is "1", the buffer chip 11 is switched to the SRAM 20, and when the SCB is not "1", the buffer chip 11 is switched to the DRAM 130. If there is any match between row/column/bank/rank addresses and the WBA table SRAM 20, a match signal MATCH_RANK# and an entry identification (EID) number and/or SCBs may be transferred to the data SRAM 20 and a data multiplexing switch.

Figure 31B:
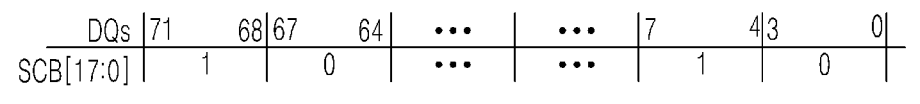

FIGS. 31A and 31B illustrate a format of a metatable, according to at least one example embodiment.

FIG. 31A illustrates the metatable of a ×4-based module which is stored in the NVM 30. The metatable may include rank addresses, the effective number of WBAs, row addresses, column addresses, bank addresses, and SCB mapping bits.

A metatable Meta0 of a first rank may consist of a 00 rank address, the number of WBAs ENmax0, a row address WBA[46:32], a column address WBA[31:21], a bank address WBA[20:18], and SCB bits WBA[17:0]. A metatable Meta1 of a second rank may consist of a 01 rank address, the number of WBAs ENmax1, a row address WBA[46:32], a column address WBA[31:21], a bank address WBA[20:18], and SCB bits WBA[17:0].

A metatable Meta2 of a third rank may consist of a 10 rank address, the number of WBAs ENmax2, a row address WBA[46:32], a column address WBA[31:21], a bank address WBA[20:18], and SCB bits WBA[17:0]. A metatable Meta3 of a fourth rank may consist of a 00 rank address, the number of WBAs ENmax0, a row address WBA[46:32], a column address WBA[31:21], a bank address WBA[20:18], and SCB bits WBA[17:0].

Referring to FIG. 31B, a ×4 DRAM chip may be directly mapped by using SCB[17:0] bits. For example, the SCB[0] may be mapped to DQ0 through DQ3, and the SCB[1] may be mapped to DQ4 through DQ7. The rest of the SCB bits may be sequentially allocated to 4 DQs, and thus, the SCB[16] may be mapped to DQ64 through DQ67, and the SCB[17] may be mapped to DQ68 through DQ71.

Mapped DQs that correspond to bits set as "1" from among the SCB[17:0] bits may be switched to the SRAM 20. For example, because the SCB[1] and the SCB[17] are set as "1", the DQ4 through DQ7 and the DQ68 through DQ71 may be switched to the SRAM 20.

Figure 32B:
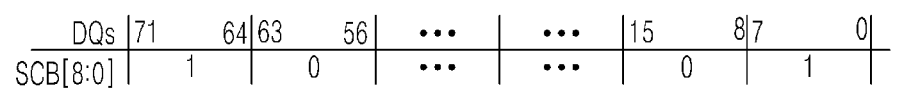

FIGS. 32A and 32B illustrate a format of the NVM 30, according to at least one example embodiment.

FIG. 32A illustrates a metatable of a ×8-based module which is stored in the NVM 30. The metatable may include rank addresses, the effective number of WBAs, row addresses, column addresses, bank addresses, and SCB mapping bits.

A metatable Meta0 of a first rank may consist of a 00 rank address, the number of WBAs ENmax0, a row address WBA[36:22], a column address WBA[21:11], a bank address WBA[11:9], and SCB bits WBA[8:0]. A metatable Meta1 of a second rank may consist of a 01 rank address, the number of WBAs ENmax1, a row address WBA[36:22], a column address WBA[21:12], a bank address WBA[11:9], and SCB bits WBA[8:0].

A metatable Meta2 of a third rank may consist of a 10 rank address, the number of WBAs ENmax2, a row address WBA[36:22], a column address WBA[21:12], a bank address WBA[11:9], and SCB bits WBA[8:0]. A metatable Meta3 of a fourth rank may consist of an 11 rank address, the number of WBAs ENmax3, a row address WBA[36:22], a column address WBA[21:12], a bank address WBA[11:9], and SCB bits WBA[8:0].

Referring to FIG. 32B, a ×8 DRAM chip may be directly mapped by using SCB[8:0] bits. For example, the SCB[0] may be mapped to DQ0 through DQ7, and the SCB[1] may be mapped to DQ8 through DQ15. The rest of the SCB bits may be sequentially allocated to 8 DQs, and thus, the SCB[7] may be mapped to DQ56 through DQ63, and the SCB[8] may be mapped to DQ64 through DQ71. Mapped DQs that correspond to bits set as "1" from among the SCB[8:0] bits may be switched to the SRAM 20. For example, because the SCB[0] and the SCB[8] are set as "1", the DQ0 through DQ7 and the DQ64 through DQ71 may be switched to the SRAM 20.

The SRAM 20 may be formed as a content-addressable memory (CAM). The matching address operations and the SCB read operations may be sequentially performed by using a ternary content-addressable memory (TCAM).

Figure 33:
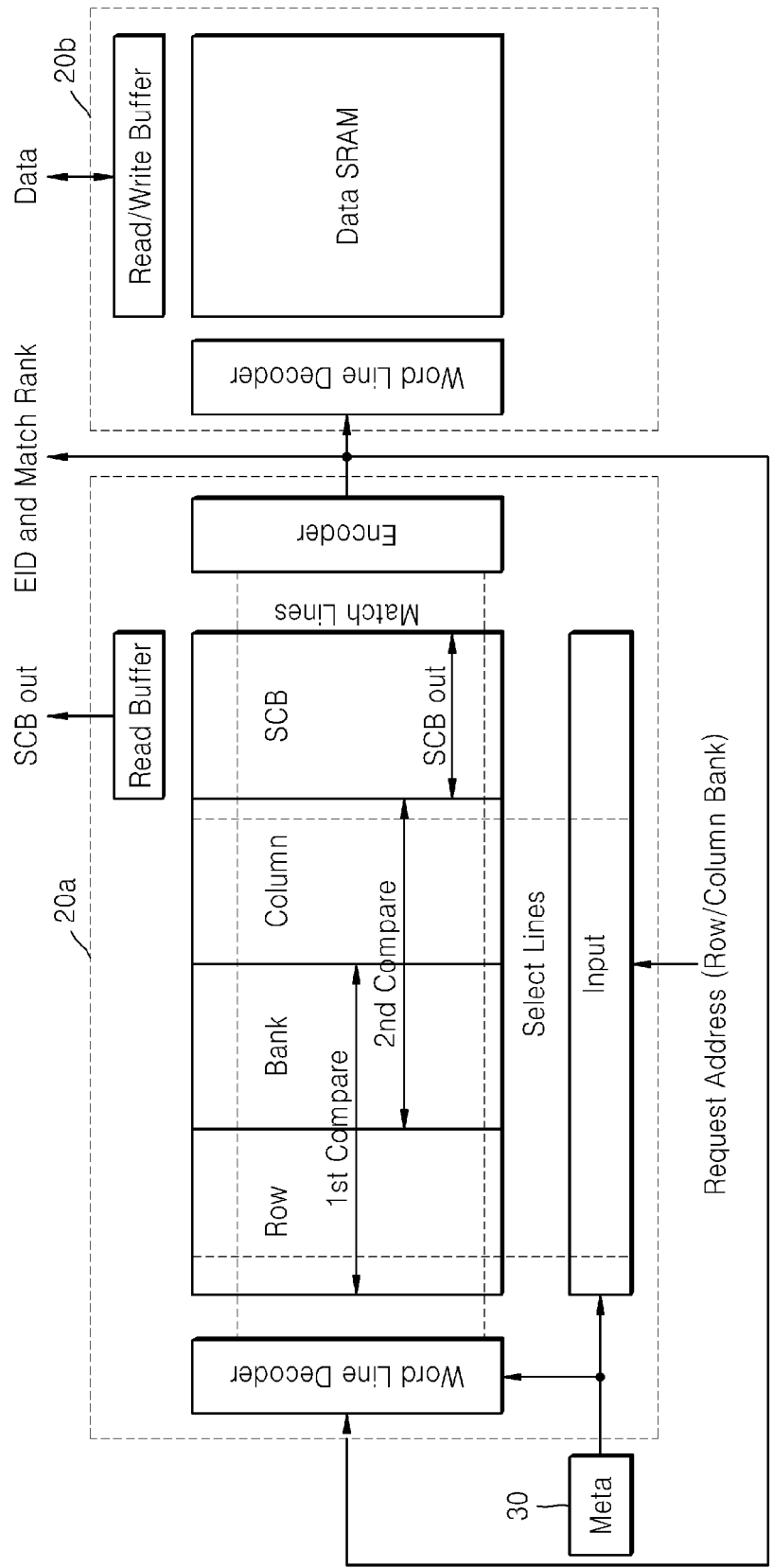
FIG. 33 is a diagram illustrating sequential matching according to at least one example embodiment.

FIG. 33 is a diagram illustrating sequential matching according to at least one example embodiment.

Referring to FIG. 33, WBAs that are stored in the metatable 30 may be stored in a WBA table SRAM 20a that is a CAM type. First, when an active command is received, a row address and a bank address may be compared in the rank-matched CAM 20a. Afterward, when a read command or a write command is applied thereto, a column address and the bank address may be compared. If there is a match, an SCB may be read at encoded EID. The metatable 30 may be set in the range of valid match lines and valid selection lines.

The WBA table SRAM 20a and the data SRAM 20 may communicate via an off-chip interface.

Figure 34:
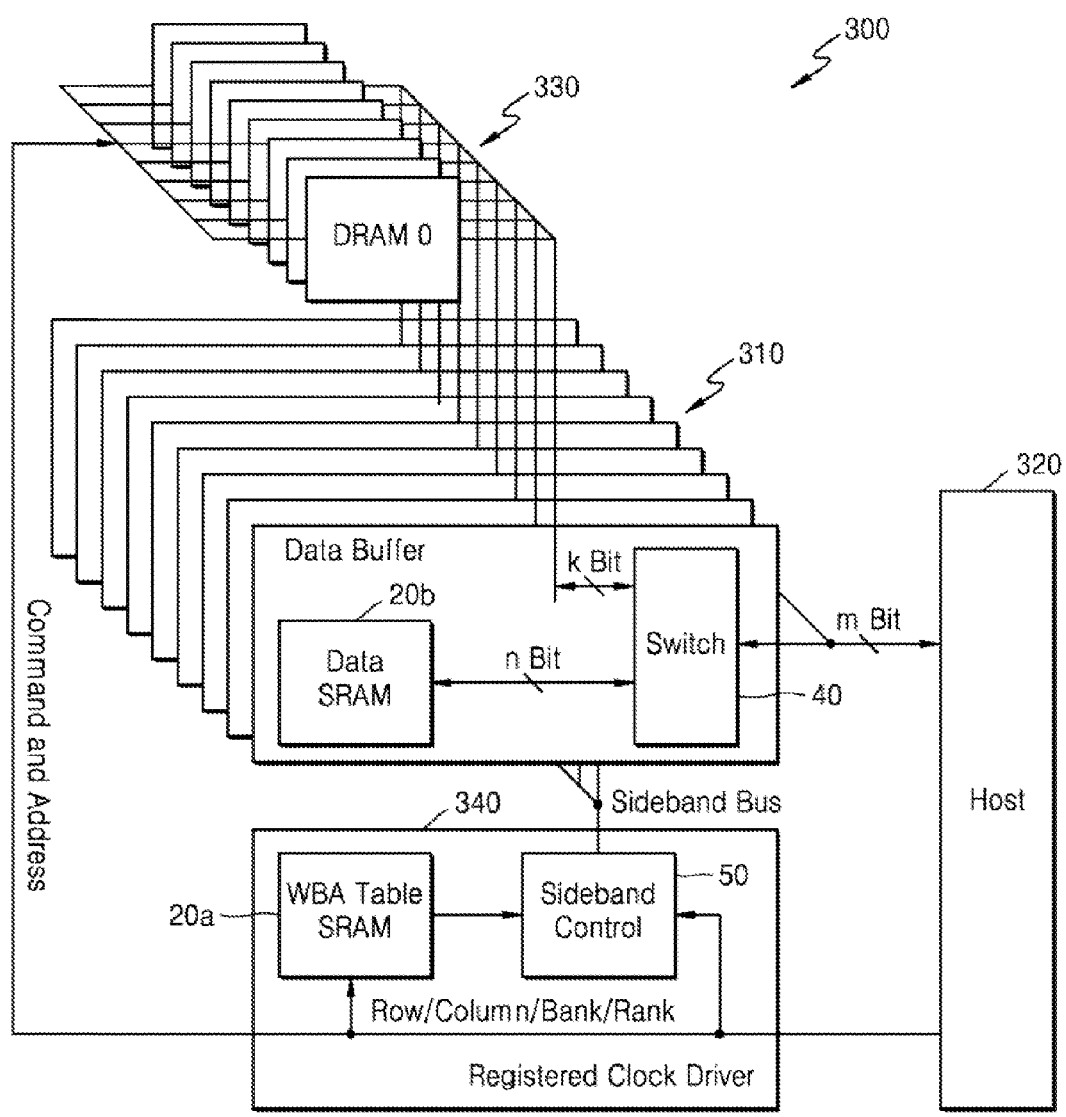
FIG. 34 is a diagram of a memory system according to at least one example embodiment.

FIG. 34 is a diagram of a memory system 300 according to at least one example embodiment.

Referring to FIG. 34, the memory system 300 includes first memory buffer chips 310, a second memory buffer chip 340, a host 320, and a memory device 330. The memory device 330 may be formed of a plurality of DRAM chips. The first memory buffer chips 310 may be connected to the DRAM chips 330, respectively, and the number of first memory buffer chips 310 may be equal to the number of DRAM chips 330.

The first memory buffer chip 310 may include a data SRAM 20b for storing data that is intended to be stored in a WBA of the corresponding DRAM chip 330, and a switch 40 for switching the DRAM chip 330 or the data SRAM 20b. The second memory buffer chip 340 may include a WBA table SRAM 20a and a sideband control unit 50. The first memory buffer chips 310 and the second memory buffer chip 340 may communicate via sideband buses (SBB). The WBA table SRAM 20a and the data SRAM 20b may communicate via an off-chip interface.

In the DRAM chip 330, if WBAs are transferred to the second memory buffer chip 340 but there are no direct paths therebetween, the WBAs may be first transferred to the host 320, and then, the host 320 may transfer the WBAs to the second memory buffer chip 340. The WBAs may be stored in the WBA table SRAM 20a and/or an NVM (not shown).

The SBB may consist of sideband clocks SBCK, /SBCK, sideband control signals, a plurality of pieces of sideband control data SBCD, and a data window signal for the plurality of pieces of sideband control data SBCD. A sideband control data packet may be transferred via the SBB.

FIGS. 35 and 36 illustrate a layout and fields of a sideband control data packet, according to at least one example embodiment.

FIG. 35 with reference to FIG. 36 illustrates a configuration of the sideband control data packet when SBB have a 6-bit width. First through sixth SBCD packets SBCD0 through SBCD5 may be formed of a 4-cycle layout.

2 bits SBCD1[0]:SBCD0[0] of a first cycle may configure a command COM[1:0]. The command COM[1:0] may be set as read(00)/write(01)/control status register(10)/no match (11). 2 bits SBCD3[0]:SBCD2[0] may configure rank IDs RID[1:0] of 4 ranks maximum. 1 bit SBCD4[0] may configure a burst chop (CHP) that determines BL8 or BL4. 3 bits SBCD1[1], SBCD0[1], and SBCD5[0] may configure burst ordering (BOD).

10 bits SBCD5[2], SBCD4[2], SBCD3[2], SBCD2[2], SBCD1[2], SBCD0[2], SBCD5[1], SBCD4[1], SBCD3[1], and SBCD2[1] may configure EID number EID[9:0] when the number of WBAs is 1024. In a ×4 nibble-base case, 5 bits SBCD4[3], SBCD3[3], SBCD2[3], SBCD1[3], and SBCD0 [3] may configure an SCB SCB[4:0]. The remaining 1 bit is reserved.

For replacement, SCBs are used to identify one of 18 nibble-wide DQs, so that 5-bit SCBs are sufficient. In order to replace multiple nibble-wide DQs, it is necessary to add more bits to the SCB. However, this may cause an increase of a bus width of the SBB without an increase of an operation frequency of the SBB. The SBB may be expected to operate in an in-band frequency as normal command/address buses.

Figure 38:
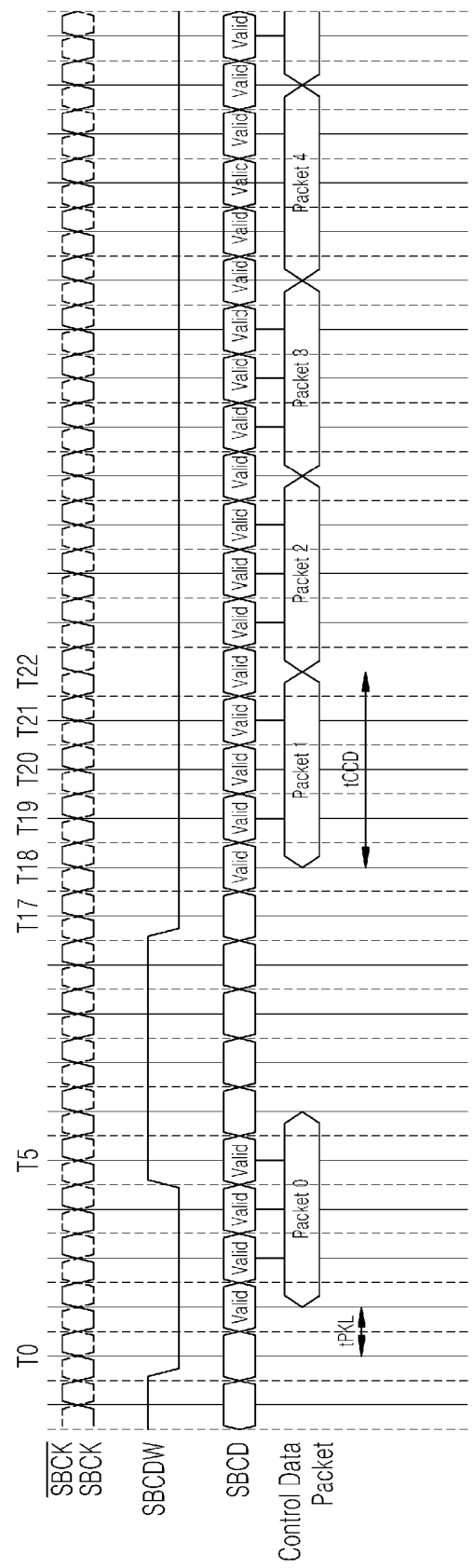

FIGS. 37 and 38 illustrate operation timing of SBB, according to at least one example embodiment.

Referring to FIG. 37, at T0 timing, the buffer chip 110 may be initialized and then, all SBCD bits may be set as "1".

At T2 timing, if there is an address match, COM field bits SBCD0 and SBCD1 may be changed to "00" or "01", and a first-matched control data packet may be transferred to the next 3 cycles T3 through T5. After that, if there is no address match, the COM field bits SBCD0 and SBCD1 may be reset as "11". If a match continues, new data packets may be transferred at every 4 cycles.

If a variable packet length is introduced, as illustrated in FIG. 38, separate preamble/postamble signals SBCDW may be used to assure a valid packet window. When the separate preamble/postamble signals SBCDW are set as "low", a valid transfer of control data may be initiated in the next cycle tPKL, PacKet Latency. The valid transfer of control data may continue until the separate preamble/postamble signals SBCDW are reset as "high".

The transfer of control data may have to conform to timing constraints. Examples of the timing constraints may include 'each WBA table performs 1 row address match in a tRRD time window', 'each WBA table performs 1 column address match in a tCCD time window', 'a control data packet has to be transferred within a tCCD time window', or the like.

SRAM reliability may be improved by performing SRAM scrubbing during a refresh cycle of the DRAM 130. In order to prevent accumulation of multi-bit errors of the SRAM 20 and to correct single-bit errors of the SRAM 20, self-scrubbing ECC circuit units may operate.

Figure 39:
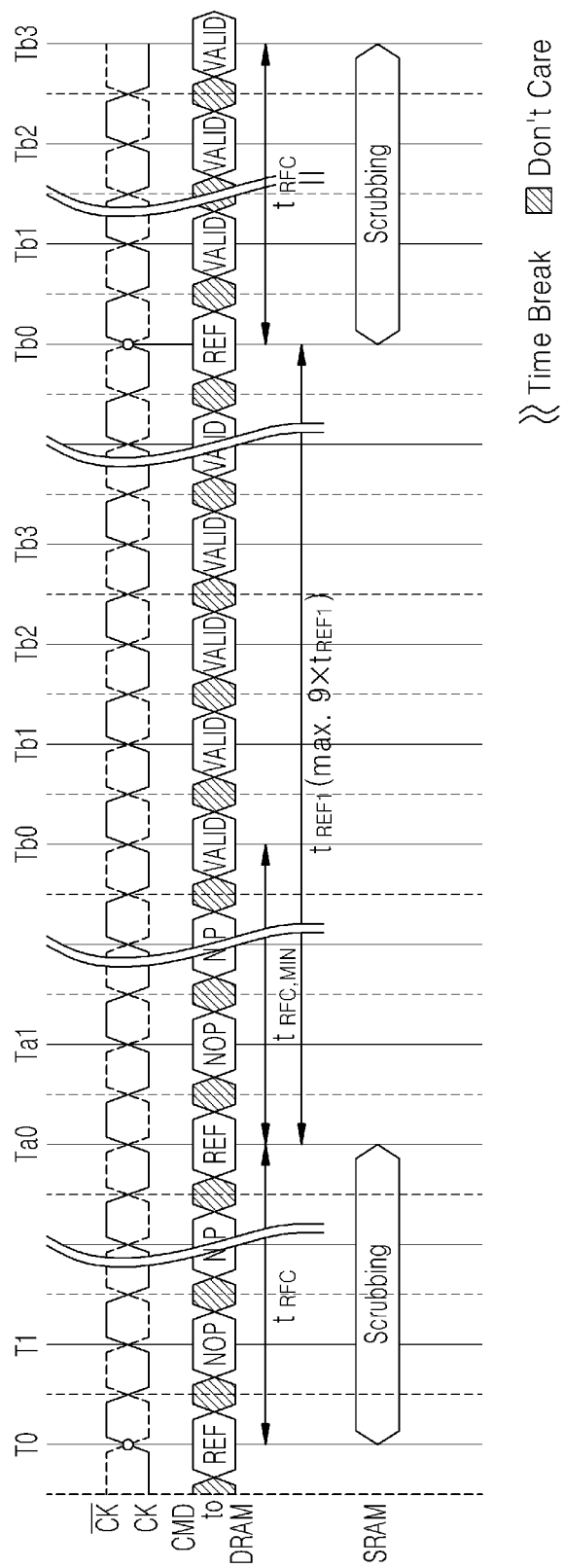
FIG. 39 illustrates SRAM error handling according to at least one example embodiment.

FIG. 39 illustrates SRAM error handling according to at least one example embodiment.

Referring to FIG. 39, when a refresh command is applied to the DRAM 130, an SRAM scrubbing operation may be performed. A self-scrubbing interval may be programmed, or a self-scrubbing operation may be disabled.

Power management may be performed on a WBA table, a data SRAM, and a DRAM that are rand-based. Power saving modes of the WBA table and the data SRAM may be basically rank-based and may be controlled as a power saving mode of the DRAM.

FIG. 40 illustrates power management according to at least one example embodiment.

Referring to FIG. 40, when the DRAM 130 is in an active power down mode, a precharge power down mode, an auto-refresh mode, a self-refresh mode, a partial self-refresh mode (PASR), or a BFM mode, a power of a core array block of a WBA table and the data SRAM 20 may be turned on, and a circuit block adjacent to the data SRAM 20 may be turned off. When the DRAM 130 is in the auto-refresh mode, and when scrubbing is performed on the WBA table and the data SRAM 20, the circuit block adjacent to the data SRAM 20 may be turned on. Also, when the DRAM 130 is in the BFM mode, if necessary, the circuit block adjacent to the data SRAM 20 may be turned on.

A start and wake-up of power saving modes of the WBA table and the data SRAM 20 may be first performed, compared to the DRAM 130, so that a predetermined or reference timing penalty may be expected. In order to reduce the amount of a power increase due to the WBA table and the data SRAM 20 during read/write operations with respect to the DRAM 130, data input/output buffers of the DRAM 130 that is to be replaced with the SRAM 20 at a given request address may be turned off. Alternatively, a data path of the DRAM 130 may be turned off by using an additional pin or operationally available pins, e.g., data mask (DM) signals.

Figure 41:
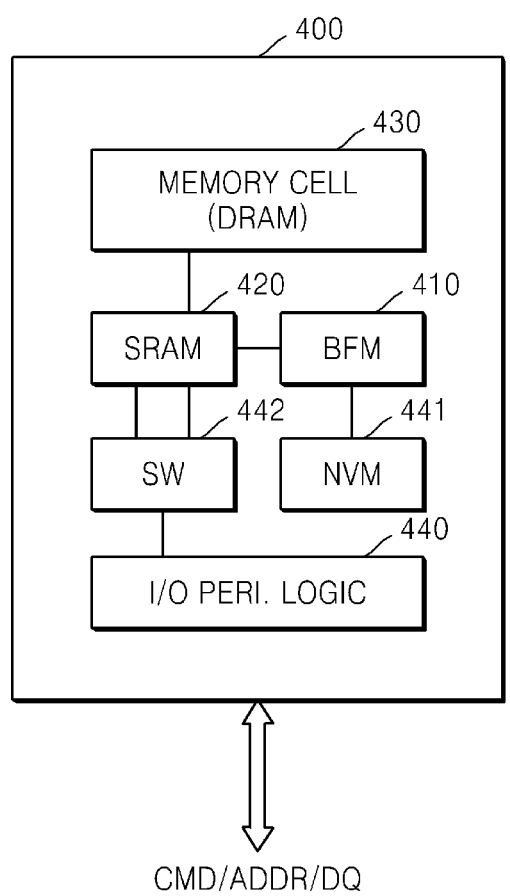
FIG. 41 is a diagram of a memory device according to at least one example embodiment.

FIG. 41 is a diagram of a memory device 400 according to at least one example embodiment.

Referring to FIG. 41, the memory device 400 includes a test unit 410, a first memory region 430, a second memory region 420, and a peripheral logic circuit unit 440. The test unit 410 may correspond to the BFM 10. The first memory region 430 may consist of DRAM cells, and the second memory region 420 may consist of SRAM cells.

The memory device 400 may selectively further include a switch 442 that selectively accesses an NVM region 441 such as a fuse array or an anti-fuse array, the first memory region 430, or the second memory region 420. For convenience of description, the test unit 410 may be referred to as 'BFM 410', the first memory region 430 may be referred to as 'DRAM region 430', and the second memory region 420 may be referred to as 'SRAM region 420'.

The BFM 410 may screen a weak bit in the first memory region 430. The BFM 410 may use a built-in self-test technique capable of detecting a weak cell at a factory level, and thus, may replace the weak bit in the DRAM region 430 by using the SRAM region 420, and in this regard, the replacement may be transparent to the host 320.

A screened WBA may be stored in the SRAM region 420 and the NVM region 441. The peripheral logic circuit unit 440 may control an access to the WBA to be performed in the SRAM region 420, instead of the DRAM region 430, by using the switch 442.

The BFM 410 may screen the WBA by using a test sequence consisting of various combinations of a command and addressing. In a test, an active-precharge command without a read or write command may be generated. The test sequence may generate a nested address pattern in which a lower address sequence loop exits in an upper address sequence loop.

The test sequence may program a size of a stride or a jump in a column direction. Alternatively, the test sequence may program a size of a stride or a jump in both row and column directions. Test patterns may be repeated back and forth in two designated rows. Alternatively, an active-precharge operation may be repeatedly performed on one row. In the test, the number of NOPs between active-precharge commands may be adjusted.

The BFM 410 may change a DC bias level of the memory device 400 during the test and may program user-set test sequences. The BFM 410 may provide a user with allowance with respect to testing various types of test sequences not only in the factory but also in the in-field.

The BFM 410 may log an error by screening the WBA in the factory and may store the WBA. When the error is detected during a test flow, a corresponding error address and data are logged in an error log register. Whenever an error occurs, it is checked whether all error log registers are filled, and the checking operation may be automatically performed.

If all error log registers are not filled, the test flow continues. If all of the error log registers are filled, addresses and a plurality of pieces of data stored in the error log registers are dumped to the NVM region 441. Afterward, the test flow automatically continues, so that next errors may be stored. Also, during in-field operations, the BFM 410 may update WBAs of the second memory region 420 in real-time by a request from the host 320 or by ECC in the host 320.

The BFM 410 may provide a protocol so as to adjust an internal DC voltage level of the DRAM region 430 by using a mode register in the memory device 400. For example, an MR3 mode register may be used. The MR3 mode register may be set to be controlled by a buffer chip or a test equipment. A3 through A10 bits that are linked with the MR3 mode register may be set to control DC levels. The register field bits may be controlled by any one of the test equipment and a user-defined test sequence program. For example, a BFM register bit[48:41] may be set as four types of DCs. Each of the DCs may be set as four different levels. The level setting may be requested to the user-defined test sequence program that changes DC voltage levels when required.

The BFM 410 may adjust AC timing parameters in the memory device 400 with a predetermined or reference resolution. The AC timing parameters may include tRAS, tRP, tRCD, tWR, tREF, tPAUSE, and the like. The AC timing may be adjusted based on a clock period tCK in the memory device 400. An AC timing control register included in the memory device 400 may be controlled by the buffer chip or the test equipment. In one test sequence, AC timing of a cell that is accessed to cause stress and AC timing of a cell that is accessed for a test-free condition may be differentially applied.

The SRAM region 420 may include a WBA table. The WBA table may store row addresses, column addresses, bank addresses, and rank addresses. Also, the SRAM region 420 may store data that corresponds to the WBA and that is stored in the DRAM region 430.

A bit unit of the WBA table and the SRAM region 420, which is to be repaired, may be determined according to DRG. The DRG may be determined by a bit unit, a chip unit, a chip group unit, or a rank unit. A capacity of the WBA table may be determined according to the number of repairable WBAs, a combination of field lengths of the repairable WBAs, and the DRG. Because the WBAs are transferred in a fixed rank order such as "rank0→rank1→rank2→rank3", the WBAs may be automatically sorted in each rank.

The SRAM region 420 may store a rank-based WBA table. The rank-based WBA table may store row addresses, column addresses, and bank addresses. In this case, DQ address fields do not exist. Also, an SCB is one bit that indicates match or no-match which is a comparison result between host requesting addresses and the WBAs. A plurality of pieces of data corresponding to the WBAs may be DQ mapped and may be stored in the SRAM region 420.

If the DRG is smaller than a rank data width based on a ×4 chip or a ×8 chip, the WBA table may include DQ addresses. The WBA table and the SCB may be separately used or may be combined. The combination of the DRQ and the SCB may determine a capacity of the WBA table and the SRAM region 420. As a size of the DRG is decreased, the capacity of the WBA table is increased. The SCB related to the DRG may be directly mapped to a DRAM chip, or the DRAM chip may be selected by encoding the SCB.

When the WBAs are detected by the BFM 410, the BFM 410 may update the WBAs to the NVM region 441. Alternatively, when the WBAs are generated by using an ATE, the WBAs may be stored in the NVM region 441 during a product test. In order to reduce an address matching time, ranks may perform comparison operations in a parallel manner. The rank-based WBAs may be associated with metatables and may be used to set an address match calculation mode. The metatables may consist of the effective number of WBAs and a range of WBA fields, and may be stored in the NVM region 441.

When the WBAs are generated by using the ATE, the effective number of WBAs may be transferred via additional WBA transfer cycles or may be stored in the NVM region 441 during a product test. The WBAs that are stored in the NVM region 441 may consist of metatables and may be stored in the WBA table SRAM 420 during a power-up. SCBs may be dedicatedly allocated to DQs of a DRAM chip. In this case, the SCBs may be used to identify multiple nibble-wide DQs to replace.

When the SCB is "1", the switch 442 is switched to the SRAM region 420, and when the SCB is not "1", the switch 442 is switched to the DRAM region 430. If there is any match between row/column/bank/rank addresses and the WBA table SRAM 420, a match signal and an EID number and/or SCBs may be transferred to the SRAM region 420 and the switch 442 that is a data multiplexing switch.

The WBAs that are stored in a metatable NVM that is the NVM region 441 may be stored in the WBA table SRAM 420 that is a CAM type. First, when an active command is received, a row address and a bank address may be compared in the rank-matched CAM 420. Afterward, when a read command or a write command is applied thereto, a column address and the bank address may be compared. If there is a match, an SCB may be read at encoded EID. The metatable NVM 441 may be set in the range of valid match lines and valid selection lines.

In the SRAM region 420, a WBA table SRAM portion and a data SRAM portion may communicate via an off-chip interface. The data SRAM region 420 and the switch 442 are disposed in the memory device 400, and the WBA table SRAM portion may be formed as a chip separate from the memory device 400. The separate chip may include the WBA table SRAM portion and the sideband control unit 50. An off-chip interface between the WBA table SRAM portion and the data SRAM portion that are separate from each other may communicate via SBB.

The SBB may consist of sideband clocks SBCK, /SBCK, sideband control signals, a plurality of pieces of sideband control data SBCD, and a data window signal for the plurality of pieces of sideband control data SBCD. A sideband control data packet may be transferred via the SBB. The SBB may operate in an in-band frequency as normal command/address buses.

In an operation of the SBB, the memory device 400 may be initialized and then, all SBCD bits may be set as "1". If there is an address match, COM field bits SBCD0 and SBCD1 may be changed to "00" or "01", and a first-matched control data packet may be transferred to the next 3 cycles. After that, if there is no address match, the COM field bits SBCD0 and SBCD1 may be reset as "11". If a match continues, new data packets may be transferred at every 4 cycles.

In the operation of the SBB, if a variable packet length is introduced, separate preamble/postamble signals SBCDW may be used to assure a valid packet window. When the separate preamble/postamble signals SBCDW are set as "low", a valid transfer of control data may be initiated in the next cycle tPKL, PacKet Latency. The valid transfer of control data may continue until the separate preamble/postamble signals SBCDW are reset as "high".

The transfer of control data may have to conform to timing constraints. Examples of the timing constraints may include 'each WBA table performs 1 row address match in a tRRD time window', 'each WBA table performs 1 column address match in a tCCD time window', 'a control data packet has to be transferred within a tCCD time window', or the like.

A reliability of the SRAM region 420 may be improved by performing scrubbing on the WBA table and the data SRAM region 420 during a refresh cycle of the DRAM region 430. In order to prevent accumulation of multi-bit errors of the WBA table and the data SRAM region 420 and to correct single-bit errors of the WBA table and the data SRAM region 420, self-scrubbing ECC circuit units may operate. When a refresh command is applied to the DRAM region 430, a scrubbing operation may be performed on the SRAM region 420. A self-scrubbing interval may be programmed, or a self-scrubbing operation may be disabled.

Power management may be performed on the DRAM region 430, the WBA table and the data SRAM region 420. Power saving modes of the SRAM region 420 may be basically controlled as a power saving mode of the DRAM region 430. When the DRAM region 430 is in an active power down mode, a precharge power down mode, an auto-refresh mode, a self-refresh mode, a PASR, or a BFM mode, a power of a core array block of the SRAM region 420 may be turned on, and a circuit block adjacent to the SRAM region 420 may be turned off.

When the DRAM region 430 is in the auto-refresh mode, and when scrubbing is performed on the SRAM region 420, the circuit block adjacent to the SRAM region 420 may be turned on. Also, when the DRAM region 430 is in the BFM mode, if necessary, the circuit block adjacent to the SRAM region 420 may be turned on.

A start and wake-up of power saving modes of the WBA table and the SRAM region 420 may be first performed, compared to the DRAM region 430, so that a predetermined or reference timing penalty may be expected. In order to reduce the amount of a power increase due to the SRAM region 420 during read/write operations with respect to the DRAM region 430, data input/output buffers of the DRAM region 430 that is to be replaced with the SRAM region 420 at a given request address may be turned off. Alternatively, a data path of the DRAM region 430 may be turned off by using an additional pin or operationally available pins, e.g., DM signals.

Figure 42:
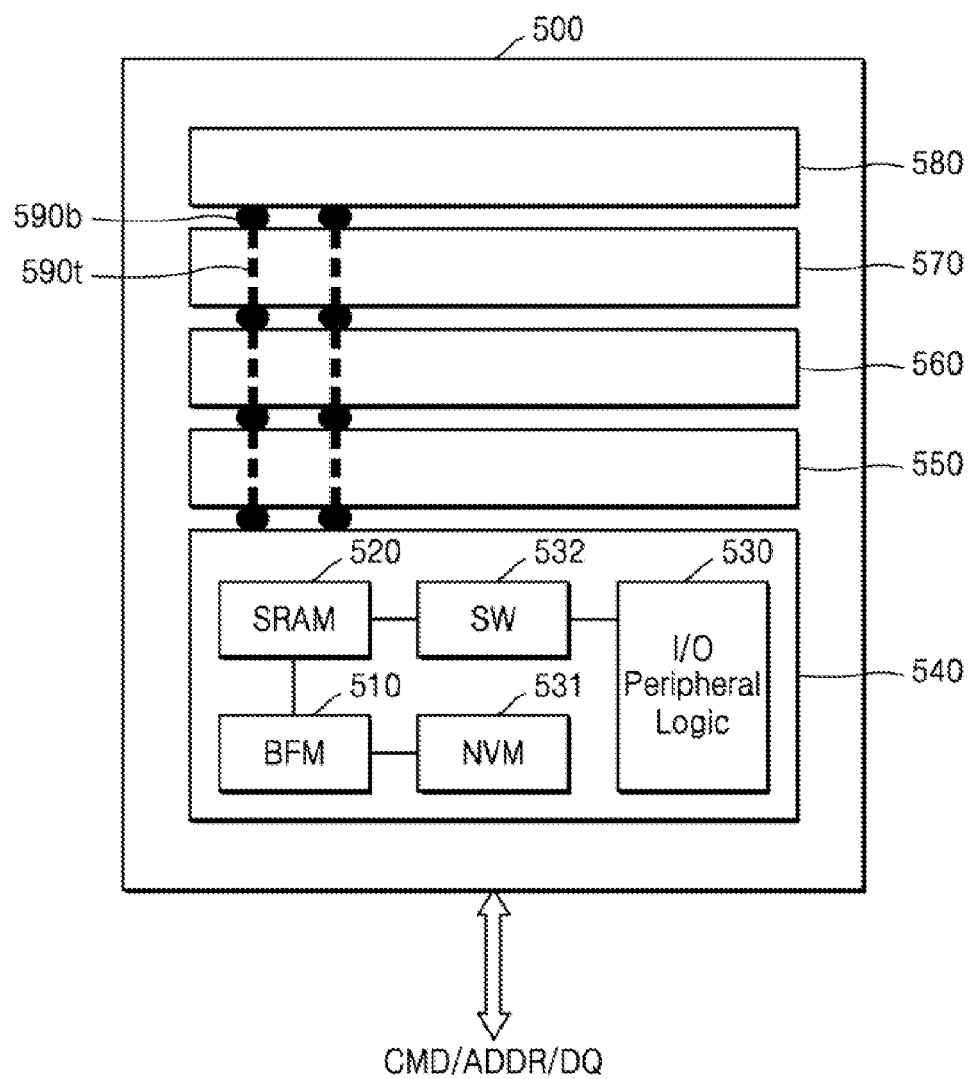
FIG. 42 is a diagram of a memory device according to at least one example embodiment.

FIG. 42 is a diagram of a memory device 500 according to at least one example embodiment.

Referring to FIG. 42, the memory device 500 has a structure in which four memory chips 550, 560, 570, and 580 are stacked as one package on an interface chip 540. The memory chips 550, 560, 570, and 580 may be formed of DRAM chips. The memory device 500 may not be limited to the four DRAM chips, and thus, more DRAM chips may be stacked.

The interface chip 540 may include a master circuit region for an interface with an external source of the memory device 500. The interface chip 540 includes a test unit 510, a memory region 520, and a peripheral logic circuit unit 530. The interface chip 540 may further include a switch 532 that selectively accesses an NVM region 531 such as a fuse array or an anti-fuse array, the DRAM chips 550, 560, 570, and 580, or the memory region 520. The test unit 510 may correspond to the BFM described above. The memory region 520 may consist of SRAM cells. For convenience of description, the test unit 510 may be referred to as 'BFM 510', the memory region 520 may be referred to as 'SRAM 520', and the NVM region 531 may be referred to as 'NVM 531'.

The interface chip 540 and the DRAM chips 550, 560, 570, and 580 may be stacked and be electrically connected to each other via through silicon vias (TSVs) 590*t* and microbumps 590*b*. In the stack structure of the present embodiment, the interface chip 540 and the DRAM chips 550, 560, 570, and 580 are connected to each other via the TSVs 590*t* and the microbumps 590*b*. However, the present embodiment is not limited thereto, and thus may also be applied to a stack structure in which the interface chip 540 and the DRAM chips 550, 560, 570, and 580 are stacked by using wire bonding, interpose, or a wiring tape.

Also, the interface chip 540 and the DRAM chips 550, 560, 570, and 580 may be connected to each other via optical input/output (IO) connection. For example, the interface chip 540 and the DRAM chips 550, 560, 570, and 580 may be connected to each other by using a radiative method using a radio frequency (RF) or ultrasound, an inductive coupling method using magnetic induction, or a non-radiative method using magnetic resonance.

The radiative method involves wirelessly transferring a signal by using an antenna such as a monopole antenna, a planar inverted-F antenna (PIFA), or the like. According to the radiative method, an electric field and a magnetic field that change according to time affect each other so that radiation occurs, and if there is an antenna having the same frequency, a signal may be adjusted to conform to a polarization characteristic of an incident wave.

The inductive coupling method involves generating a strong magnetic field in one direction by winding a coil a plurality of times, and generating coupling by approaching two coils that resonate at a similar frequency.

The non-radiative method uses evanescent wave coupling in which electromagnetic waves move between two mediums via a short range electromagnetic field, wherein the two mediums resonate at the same frequency.

The BFM 510 of the interface chip 540 may screen a weak bit in the DRAM chips 550, 560, 570, and 580. The BFM 510 may use a built-in self-test technique capable of detecting a weak cell at a factory level, and thus, may replace the weak bit in the DRAM chips 550, 560, 570, and 580 by using the SRAM 520 of the interface chip 540, and in this regard, the replacement may be transparent to a host (not shown).

A WBA of the DRAM chips 550, 560, 570, and 580 may be stored in the SRAM 520 and the NVM 531. The peripheral logic circuit unit 530 may control an access to the WBA to be performed in the SRAM 520 of the interface chip 540, instead of the DRAM chips 550, 560, 570, and 580, by using the switch 532.

The BFM 510 may screen the WBA by using a test sequence consisting of various combinations of a command and addressing. The test sequence may generate a nested address pattern in which a lower address sequence loop exits in an upper address sequence loop. The BFM 510 may change a DC bias level of the DRAM chips 550, 560, 570, and 580 during the test and may program user-set test sequences. The BFM 510 may adjust AC timing parameters in the DRAM chips 550, 560, 570, and 580 with a predetermined or reference resolution.

The SRAM 520 of the interface chip 540 may store a WBA table. The WBA table may store row addresses, column addresses, bank addresses, and rank addresses. Also, the SRAM 520 may store data that corresponds to the WBA and that is stored in the DRAM chips 550, 560, 570, and 580. A bit unit of the WBA table and the data SRAM 520, which is to be repaired, may be determined according to DRG. The DRG may be determined by a bit unit, a chip unit, a chip group unit, or a rank unit.

When WBAs are detected by the BFM 510, the BFM 510 may update the WBAs to the NVM 531. Alternatively, when the WBAs are generated by using an ATE, the WBAs may be stored in the NVM 531 during a product test. In order to reduce an address matching time, ranks may perform comparison operations in a parallel manner. The rank-based WBAs may be associated with metatables and may be used to set an address match calculation mode. The metatables may consist of the effective number of WBAs and a range of WBA fields, and may be stored in the NVM 531.

The WBAs that are stored in a metatable NVM that is the NVM 531 may be stored in the WBA table SRAM 520 that is a CAM type. First, when an active command is received, a row address and a bank address may be compared in the rank-matched CAM 520. Afterward, when a read command or a write command is applied thereto, a column address and the bank address may be compared. If there is a match, an SCB may be read at encoded EID. The metatable NVM 531 may be set in the range of valid match lines and valid selection lines.

In the SRAM 520, a WBA table SRAM portion and a data SRAM portion may communicate via an off-chip interface. The data SRAM 520 and the switch 532 are disposed in the interface chip 540, and the WBA table SRAM portion may be formed as a chip separate from the memory device 500. The separate chip may include the WBA table SRAM portion and a sideband control unit (not shown). An off-chip interface between the WBA table SRAM portion and the data SRAM portion that are separate from each other may communicate via SBB.

A reliability of the SRAM 520 may be improved by performing scrubbing on the WBA table and the data SRAM 520 during a refresh cycle of the DRAM chips 550, 560, 570, and 580. In order to prevent accumulation of multi-bit errors of the WBA table and the data SRAM 520 and to correct single-bit errors of the WBA table and the data SRAM 520, self-scrubbing ECC circuit units may operate. When a refresh command is applied to the DRAM chips 550, 560, 570, and 580, a scrubbing operation may be performed on the SRAM 520. A self-scrubbing interval may be programmed, or a self-scrubbing operation may be disabled.

Power management may be performed on the DRAM chips 550, 560, 570, and 580, and the WBA table and the data SRAM 520 of the interface chip 540. Power saving modes of the SRAM 520 may be basically controlled as a power saving mode of the DRAM chips 550, 560, 570, and 580. When the DRAM chips 550, 560, 570, and 580 are in an active power down mode, a precharge power down mode, an auto-refresh mode, a self-refresh mode, a PASR, or a BFM mode, a power of a core array block of the SRAM 520 may be turned on, and a circuit block adjacent to the SRAM 520 may be turned off.

A start and wake-up of power saving modes of the WBA table and the data SRAM 520 of the interface chip 540 may be first performed, compared to the DRAM chips 550, 560, 570, and 580, so that a predetermined or reference timing penalty may be expected. In order to reduce the amount of a power increase due to the SRAM 520 during read/write operations with respect to the DRAM chips 550, 560, 570, and 580, data input/output buffers of the DRAM chips 550, 560, 570, and 580 that are to be replaced with the SRAM 520 at a given request address may be turned off. Alternatively, data paths of the DRAM chips 550, 560, 570, and 580 may be turned off by using an additional pin or operationally available pins, e.g., DM signals FIG. 43 is a diagram of a memory module 600 according to at least one example embodiment.

Figure 43:
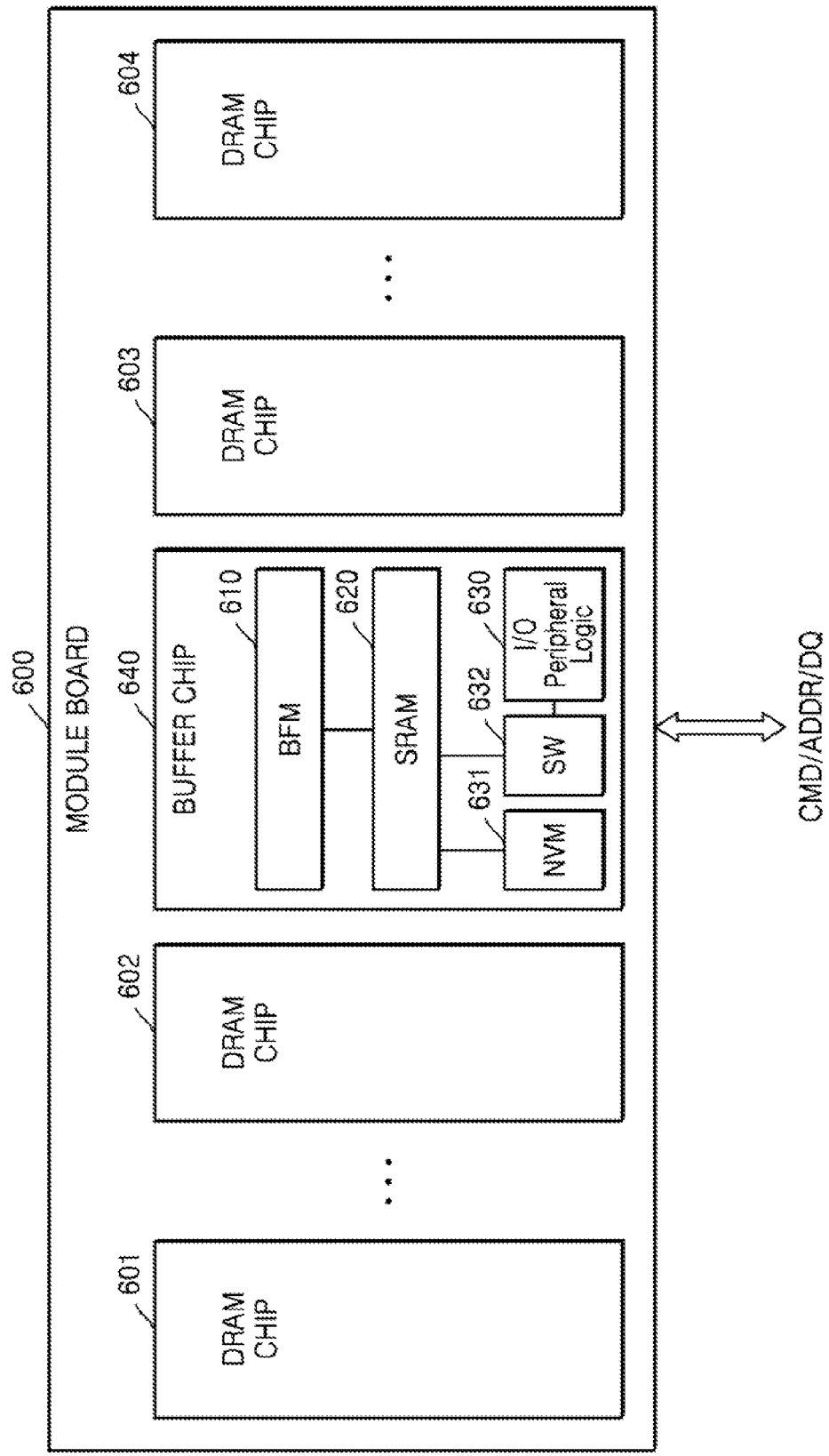
FIG. 43 is a diagram of a memory module according to at least one example embodiment.

Referring to FIG. 43, the memory module 600 may include one or more semiconductor memory devices 601 through 604, and a memory buffer chip 640 which are mounted on a module board. DRAM chips including DRAM cells may be formed as the semiconductor memory devices 601 through 604. The memory buffer chip 640 manages operations of the semiconductor memory devices 601 through 604. The memory buffer chip 640 includes a test unit 610, a memory region 620, and a peripheral logic circuit unit 630. The memory buffer chip 640 may further include a switch 632 that selectively accesses an NVM region 631 such as a fuse array or an anti-fuse array, the DRAM chips 601 through 604, or the memory region 620. The test unit 610 may correspond to the BFM described above. The memory region 620 may consist of SRAM cells. For convenience of description, the test unit 610 may be referred to as 'BFM 610', the memory region 620 may be referred to as 'SRAM 620', and the NVM region 631 may be referred to as 'NVM 631'.

The memory module 600 may have one of various forms. For example, the memory module 600 may be applied to various memory modules including a single in-line memory module (SIMM), a dual in-line memory module (DIMM), a small-outline DIMM (SO-DIMM), an unbuffered DIMM (UDIMM), a fully-buffered DIMM (FBDIMM), a rank-buffered DIMM (RBDIMM), a load-reduced DIMM (LRDIMM), a mini-DIMM, and a micro-DIMM. In the LRDIMM-type memory module, one or more ranks for memory operations may be defined, and the DRAM chips 601 through 604 may be respectively defined as ranks that are different from each other.

The BFM 610 of the memory buffer chip 640 may screen a weak bit in the DRAM chips 601 through 604. The BFM 610 may use a built-in self-test technique capable of detecting a weak cell at a factory level, and thus, may replace the weak bit in the DRAM chips 601 through 604 by using the SRAM 620 of the memory buffer chip 640, and in this regard, the replacement may be transparent to a host (not shown).

A WBA of the DRAM chips 601 through 604 may be stored in the SRAM 620 and the NVM 631 of the memory buffer chip 640. The peripheral logic circuit unit 630 may control an access to the WBA to be performed in the SRAM 620 of the memory buffer chip 640, instead of the DRAM chips 601 through 604, by using the switch 632.

A screened WBA may be stored in the SRAM 620 and the NVM 631. The peripheral logic circuit unit 630 may control an access to the WBA to be performed in the SRAM 620, instead of the DRAM chips 601 through 604, by using the switch 632.

The BFM 610 may screen the WBA by using a test sequence consisting of various combinations of a command and addressing. In a test, an active-precharge command without a read or write command may be generated. The test sequence may generate a nested address pattern in which a lower address sequence loop exits in an upper address sequence loop.

The BFM 610 may change a DC bias level of the DRAM chips 601 through 604 mounted in the memory module 600 during the test and may program user-set test sequences. The BFM 610 may provide a user with allowance with respect to testing various types of test sequences not only in the factory but also in the in-field.

The BFM 610 may log an error by screening the WBA in the factory and may store the WBA. When the error is detected during a test flow, a corresponding error address and data are logged in an error log register. Whenever an error occurs, it is checked whether all error log registers are filled, and the checking operation may be automatically performed.

If all error log registers are not filled, the test flow continues. If all of the error log registers are filled, addresses and a plurality of pieces of data stored in the error log registers are dumped to the NVM 631. Afterward, the test flow automatically continues, so that next errors may be stored. Also, during in-field operations, the BFM 610 may update WBAs of the SRAM 620 in real-time by a request from the host or by ECC in the host.

The BFM 610 may provide a protocol so as to adjust internal DC voltage levels of the DRAM chips 601 through 604 by using a mode register in the DRAM chips 601 through 604 mounted in the memory module 600. For example, an MR3 mode register may be used. The MR3 mode register may be set to be controlled by the memory buffer chip 640 or a test equipment.

The BFM 610 may adjust AC timing parameters in the DRAM chips 601 through 604 mounted in the memory module 600 with a predetermined or reference resolution. The AC timing parameters may include tRAS, tRP, tRCD, tWR, tREF, tPAUSE, and the like. The AC timing may be adjusted based on a clock period tCK in the DRAM chips 601 through 604. An AC timing control register included in the DRAM chips 601 through 604 may be controlled by the memory buffer chip 640 or the test equipment. In one test sequence, AC timing of a cell that is accessed to cause stress and AC timing of a cell that is accessed for a test-free condition may be differentially applied.

The SRAM 620 may include a WBA table. The WBA table may store row addresses, column addresses, bank addresses, and rank addresses. Also, the SRAM 620 may store data that corresponds to the WBA and that is stored in the DRAM chips 601 through 604.

A bit unit of the WBA table and the SRAM 620, which is to be repaired, may be determined according to DRG. The DRG may be determined by a bit unit, a chip unit, a chip group unit, or a rank unit. A capacity of the WBA table may be determined according to the number of repairable WBAs, a combination of field lengths of the repairable WBAs, and the DRG. Because the WBAs are transferred in a fixed rank order such as "rank0→rank1→rank2→rank3", the WBAs may be automatically sorted in each rank.

The SRAM 620 may store a rank-based WBA table. The rank-based WBA table may store row addresses, column addresses, and bank addresses. In this case, DQ address fields do not exist. Also, an SCB is one bit that indicates match or no-match which is a comparison result between host requesting addresses and the WBAs. A plurality of pieces of data corresponding to the WBAs may be DQ mapped and may be stored in the data SRAM region 620.

If the DRG is smaller than a rank data width based on a ×4 chip or a ×8 chip, the WBA table may include DQ addresses. The WBA table and the SCB may be separately used or may be combined. The combination of the DRQ and the SCB may determine a capacity of the WBA table and the data SRAM region 620. As a size of the DRG is decreased, the capacity of the WBA table is increased. The SCB related to the DRG may be directly mapped to a DRAM chip, or the DRAM chip may be selected by encoding the SCB.

When the WBAs are detected by the BFM 610, the BFM 610 may update the WBAs to the NVM region 631. Alternatively, when the WBAs are generated by using an ATE, the WBAs may be stored in the NVM region 631 during a product test. In order to reduce an address matching time, ranks may perform comparison operations in a parallel manner. The rank-based WBAs may be associated with metatables and may be used to set an address match calculation mode. The metatables may consist of the effective number of WBAs and a range of WBA fields, and may be stored in the NVM region 631.

When the WBAs are generated by using the ATE, the effective number of WBAs may be transferred via additional WBA transfer cycles or may be stored in the NVM region 631 during the product test. The WBAs that are stored in the NVM 631 may consist of metatables and may be stored in the WBA table SRAM 620 during a power-up. SCBs may be dedicatedly allocated to DQs of a DRAM chip. In this case, the SCBs may be used to identify multiple nibble-wide DQs to replace.

When the SCB is "1", the switch 632 is switched to the SRAM 620, and when the SCB is not "1", the switch 632 is switched to the DRAM chips 601 through 604 mounted in the memory module 600. If there is any match between row/column/bank/rank addresses and the WBA table SRAM 620, a match signal and an EID number and/or SCBs may be transferred to the data SRAM 620 and the switch 632 that is a data multiplexing switch.

The WBAs that are stored in a metatable NVM that is the NVM region 631 may be stored in the WBA table SRAM 620 that is a CAM type. First, when an active command is received, a row address and a bank address may be compared in the rank-matched CAM 620. Afterward, when a read command or a write command is applied thereto, a column address and the bank address may be compared. If there is a match, an SCB may be read at encoded EID. The metatable NVM 631 may be set in the range of valid match lines and valid selection lines.

In the SRAM 620, a WBA table SRAM portion and a data SRAM portion may communicate via an off-chip interface. The data SRAM region 620 and the switch 632 are disposed in the memory buffer chip 640, and the WBA table SRAM portion may be formed as a chip separate from the memory buffer chip 640. The separate chip may include the WBA table SRAM portion and a sideband control unit. An off-chip interface between the WBA table SRAM portion and the data SRAM portion that are separate from each other may communicate via SBB.

The SBB may consist of sideband clocks SBCK, /SBCK, sideband control signals, a plurality of pieces of sideband control data SBCD, and a data window signal for the plurality of pieces of sideband control data SBCD. A sideband control data packet may be transferred via the SBB. The SBB may operate in an in-band frequency as normal command/address buses.

In the operation of the SBB, if a variable packet length is introduced, separate preamble/postamble signals SBCDW may be used to assure a valid packet window. When the separate preamble/postamble signals SBCDW are set as "low", a valid transfer of control data may be initiated in the next cycle tPKL, PacKet Latency. The valid transfer of control data may continue until the separate preamble/postamble signals SBCDW are reset as "high".

A reliability of the SRAM 620 may be improved by performing scrubbing on the WBA table and the data SRAM region 620 during a refresh cycle of the DRAM chips 601 through 604 in the memory module 600. In order to prevent accumulation of multi-bit errors of the WBA table and the data SRAM 620 and to correct single-bit errors of the WBA table and the data SRAM region 420, self-scrubbing ECC circuit units may operate. When a refresh command is applied to the DRAM chips 601 through 604, a scrubbing operation may be performed on the SRAM 620. A self-scrubbing interval may be programmed, or a self-scrubbing operation may be disabled.

Power management may be performed on the DRAM chips 601 through 604 in the memory module 600, the WBA table and the data SRAM region 620. Power saving modes of the SRAM region 620 may be basically controlled as a power saving mode of the DRAM chips 601 through 604. When the DRAM chips 601 through 604 are in an active power down mode, a precharge power down mode, an auto-refresh mode, a self-refresh mode, a PASR, or a BFM mode, a power of a core array block of the SRAM region 620 may be turned on, and a circuit block adjacent to the SRAM region 620 may be turned off.

When the DRAM chips 601 through 604 in the memory module 600 are in the auto-refresh mode, and when scrubbing is performed on the SRAM region 620, the circuit block adjacent to the SRAM region 620 may be turned on. Also, when the DRAM chips 601 through 604 are in the BFM mode, if necessary, the circuit block adjacent to the SRAM region 620 may be turned on.

A start and wake-up of power saving modes of the WBA table and the data SRAM region 620 may be first performed, compared to the DRAM chips 601 through 604 in the memory module 600, so that a predetermined or reference timing penalty may be expected. In order to reduce the amount of a power increase due to the SRAM region 620 during read/write operations with respect to the DRAM chips 601 through 604, data input/output buffers of the DRAM chips 601 through 604 that are to be replaced with the SRAM region 620 at a given request address may be turned off. Alternatively, data paths of the DRAM chips 601 through 604 in the memory module 600 may be turned off by using an additional pin or operationally available pins, e.g., DM signals.

Figure 44:
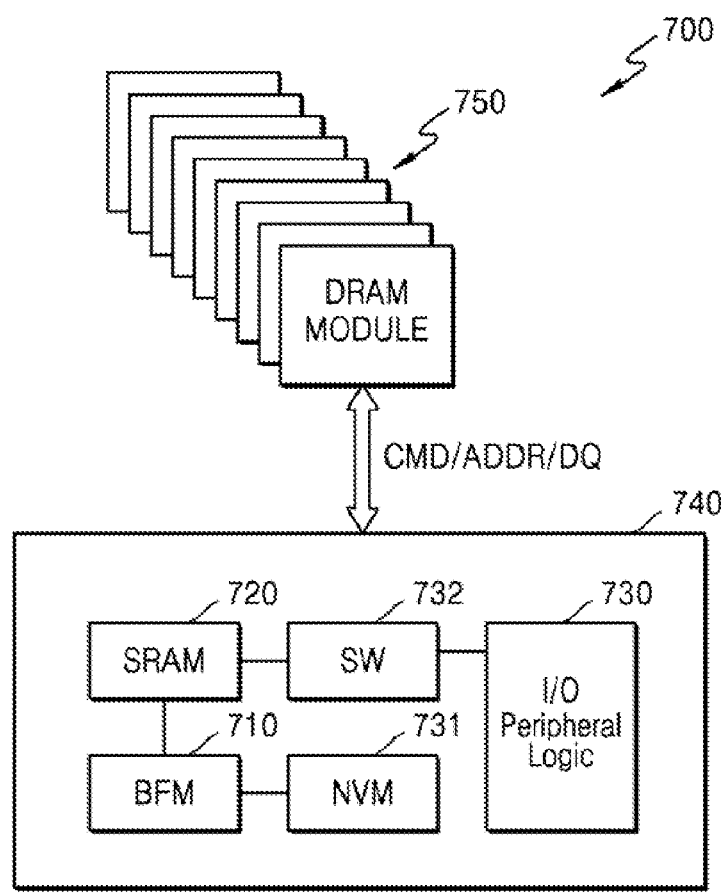
FIG. 44 is a diagram of a memory module according to at least one example embodiment.

FIG. 44 is a diagram of a memory module 700 according to at least one example embodiment.

Referring to FIG. 44, the memory module 700 may include a memory controller 740 and a plurality of memory modules 750. Each of the memory modules 750 may be formed of a DRAM module having different ranks. The memory controller 740 includes a test unit 710, a memory region 720, and a peripheral logic circuit unit 730. The memory controller 740 may further include a switch 732 that selectively accesses an NVM region 731 such as a fuse array or an anti-fuse array, the memory modules 750, or the memory region 720. The test unit 710 may correspond to the BFM described above. The memory region 720 may consist of SRAM cells. For convenience of description, the test unit 710 may be referred to as 'BFM 710', the memory region 720 may be referred to as 'SRAM 720', and the NVM region 731 may be referred to as 'NVM 731'.

The BFM 710 may screen a weak bit in a DRAM chip mounted in the memory module 750. The BFM 710 may use a built-in self-test technique capable of detecting a weak cell at a factory level, and thus, may replace the weak bit in the DRAM chip mounted in the memory module 750 by using the SRAM 720, and in this regard, the replacement may be transparent to a host (not shown).

A screened WBA may be stored in the SRAM 720 and the NVM 731. The peripheral logic circuit unit 730 may control an access to the WBA to be performed in the SRAM 720, instead of the DRAM chip mounted in the memory module 750, by using the switch 732.

The BFM 710 may screen the WBA by using a test sequence consisting of various combinations of a command and addressing. In a test, an active-precharge command without a read or write command may be generated. The test sequence may generate a nested address pattern in which a lower address sequence loop exits in an upper address sequence loop.

The BFM 710 may change a DC bias level of the DRAM chip mounted in the memory module 750 during the test and may program user-set test sequences. The BFM 710 may provide a user with allowance with respect to testing various types of test sequences not only in the factory but also in the in-field.

The BFM 710 may log an error by screening the WBA in the factory and may store the WBA. When the error is detected during a test flow, a corresponding error address and data are logged in an error log register. Whenever an error occurs, it is checked whether all error log registers are filled, and the checking operation may be automatically performed.

If all error log registers are not filled, the test flow continues. If all of the error log registers are filled, addresses and a plurality of pieces of data stored in the error log registers are dumped to the NVM 731. Afterward, the test flow automatically continues, so that next errors may be stored. Also, during in-field operations, the BFM 710 may update WBAs of the SRAM 720 in real-time by a request from the host or by ECC in the host.

The BFM 710 may provide a protocol so as to adjust an internal DC voltage level of the DRAM chip by using a mode register in the DRAM chip mounted in the memory module 750. For example, an MR3 mode register may be used. The MR3 mode register may be set to be controlled by a buffer chip or a test equipment.

The BFM 710 may adjust AC timing parameters in the DRAM chip mounted in the memory module 750 with a predetermined or reference resolution. The AC timing parameters may include tRAS, tRP, tRCD, tWR, tREF, tPAUSE, and the like. The AC timing may be adjusted based on a clock period tCK in the DRAM chip. An AC timing control register included in the DRAM chip may be controlled by the buffer chip or the test equipment. In one test sequence, AC timing of a cell that is accessed to cause stress and AC timing of a cell that is accessed for a test-free condition may be differentially applied.

The SRAM 720 may include a WBA table. The WBA table may store row addresses, column addresses, bank addresses, and rank addresses. Also, the SRAM 720 may store data that corresponds to the WBA and that is stored in the DRAM chip.

A bit unit of the WBA table and the SRAM 720, which is to be repaired, may be determined according to DRG. The DRG may be determined by a bit unit, a chip unit, a chip group unit, or a rank unit. A capacity of the WBA table may be determined according to the number of repairable WBAs, a combination of field lengths of the repairable WBAs, and the DRG. Because the WBAs are transferred in a fixed rank order such as "rank0→rank1→rank2→rank3", the WBAs may be automatically sorted in each rank.

The SRAM 720 may store a rank-based WBA table. The rank-based WBA table may store row addresses, column addresses, and bank addresses. In this case, DQ address fields do not exist. Also, an SCB is one bit that indicates match or no-match which is a comparison result between host requesting addresses and the WBAs. A plurality of pieces of data corresponding to the WBAs may be DQ mapped and may be stored in the data SRAM region 720.

If the DRG is smaller than a rank data width based on a ×4 chip or a ×8 chip, the WBA table may include DQ addresses. The WBA table and the SCB may be separately used or may be combined. The combination of the DRQ and the SCB may determine a capacity of the WBA table and the data SRAM region 720. As a size of the DRG is decreased, the capacity of the WBA table is increased. The SCB related to the DRG may be directly mapped to a DRAM chip, or the DRAM chip may be selected by encoding the SCB.

When the WBAs are detected by the BFM 710, the BFM 710 may update the WBAs to the NVM region 731. Alternatively, when the WBAs are generated by using an ATE, the WBAs may be stored in the NVM region 731 during a product test. In order to reduce an address matching time, ranks may perform comparison operations in a parallel manner. The rank-based WBAs may be associated with metatables and may be used to set an address match calculation mode. The metatables may consist of the effective number of WBAs and a range of WBA fields, and may be stored in the NVM region 731.

When the WBAs are generated by using the ATE, the effective number of WBAs may be transferred via additional WBA transfer cycles or may be stored in the NVM region 731 during the product test. The WBAs that are stored in the NVM 731 may consist of metatables and may be stored in the WBA table SRAM 720 during a power-up. SCBs may be dedicatedly allocated to DQs of a DRAM chip. In this case, the SCBs may be used to identify multiple nibble-wide DQs to replace.

When the SCB is "1", the switch 732 is switched to the SRAM 720, and when the SCB is not "1", the switch 732 is switched to the DRAM chip mounted in the memory module 750. If there is any match between row/column/bank/rank addresses and the WBA table SRAM 720, a match signal and an EID number and/or SCBs may be transferred to the data SRAM 720 and the switch 732 that is a data multiplexing switch.

The WBAs that are stored in a metatable NVM that is the NVM region 731 may be stored in the WBA table SRAM 720 that is a CAM type. First, when an active command is received, a row address and a bank address may be compared in the rank-matched CAM 720. Afterward, when a read command or a write command is applied thereto, a column address and the bank address may be compared. If there is a match, an SCB may be read at encoded EID. The metatable NVM 731 may be set in the range of valid match lines and valid selection lines.

In the SRAM 720, a WBA table SRAM portion and a data SRAM portion may communicate via an off-chip interface. The data SRAM region 720 and the switch 732 are disposed in the memory controller 740, and the WBA table SRAM portion may be formed as a chip separate from the memory controller 740. The separate chip may include the WBA table SRAM portion and a sideband control unit. An off-chip interface between the WBA table SRAM portion and the data SRAM portion that are separate from each other may communicate via SBB.

The SBB may consist of sideband clocks SBCK, /SBCK, sideband control signals, a plurality of pieces of sideband control data SBCD, and a data window signal for the plurality of pieces of sideband control data SBCD. A sideband control data packet may be transferred via the SBB. The SBB may operate in an in-band frequency as normal command/address buses.

In the operation of the SBB, if a variable packet length is introduced, separate preamble/postamble signals SBCDW may be used to assure a valid packet window. When the separate preamble/postamble signals SBCDW are set as "low", a valid transfer of control data may be initiated in the next cycle tPKL, PacKet Latency. The valid transfer of control data may continue until the separate preamble/postamble signals SBCDW are reset as "high".

A reliability of the SRAM region 720 may be improved by performing scrubbing on the WBA table and the data SRAM region 720 during a refresh cycle of the DRAM chip in the memory module 750. In order to prevent accumulation of multi-bit errors of the WBA table and the data SRAM 720 and to correct single-bit errors of the WBA table and the data SRAM 720, self-scrubbing ECC circuit units may operate. When a refresh command is applied to the DRAM chip, a scrubbing operation may be performed on the SRAM region 720. A self-scrubbing interval may be programmed, or a self-scrubbing operation may be disabled.

Power management may be performed on the DRAM chip in the memory module 750, the WBA table and the data SRAM region 720. Power saving modes of the SRAM region 720 may be basically controlled as a power saving mode of the DRAM chip. When the DRAM chip is in an active power down mode, a precharge power down mode, an auto-refresh mode, a self-refresh mode, a PASR, or a BFM mode, a power of a core array block of the SRAM region 720 may be turned on, and a circuit block adjacent to the SRAM region 720 may be turned off.

When the DRAM chip in the memory module 750 is in the auto-refresh mode, and when scrubbing is performed on the SRAM region 720, the circuit block adjacent to the SRAM region 720 may be turned on. Also, when the DRAM chip is in the BFM mode, if necessary, the circuit block adjacent to the SRAM region 720 may be turned on.

A start and wake-up of power saving modes of the WBA table and the data SRAM region 720 may be first performed, compared to the DRAM chip in the memory module 750, so that a predetermined or reference timing penalty may be expected. In order to reduce the amount of a power increase due to the SRAM region 720 during read/write operations with respect to the DRAM chip, data input/output buffers of the DRAM chip that is to be replaced with the SRAM region 720 at a given request address may be turned off. Alternatively, a data path of the DRAM chip in the memory module 750 may be turned off by using an additional pin or operationally available pins, e.g., DM signals.

Example embodiments having thus been described, it will be obvious that the same may be varied in many ways. Such variations are not to be regarded as a departure from the intended spirit and scope of example embodiments, and all such modifications as would be obvious to one skilled in the art are intended to be included within the scope of the following claims.

What is claimed is:

1. A semiconductor device comprising:
    a first memory region including a plurality of memory cells;
    a test unit configured to test the first memory region, and detect a weak bit from among the plurality of memory cells; and
    a second memory region configured to store a weak bit address (WBA) of the first memory region, and data intended to be stored in the weak bit,
    wherein the first memory region and the second memory region include different types of memory cells.

2. The semiconductor device of claim 1, further comprising a third memory region configured to store the WBA of the first memory region in a non-volatile manner.

3. The semiconductor device of claim 2, wherein the third memory region includes one of an anti-fuse array and a fuse array.

4. The semiconductor device of claim 1, wherein the plurality of memory cells of the first memory region include dynamic random access memory (DRAM) cells.

5. The semiconductor device of claim 4, wherein the weak hit corresponds to a memory cell from among the DRAM cells which has a weak refresh characteristic, a weak cell write characteristic, or a weak data retention characteristic.

6. The semiconductor device of claim 1, wherein, the test unit is configured to screen the WBA of the first memory region and then, stores the WBA and corresponding data in an error log register.

* * * * *